(12) United States Patent
Morinaga et al.

(10) Patent No.: US 8,364,437 B2
(45) Date of Patent: Jan. 29, 2013

(54) MARK ARRANGEMENT INSPECTING METHOD, MASK DATA, AND MANUFACTURING METHOD OF SEMICONDUCTOR DEVICE

(75) Inventors: Hiroyuki Morinaga, Kanagawa (JP); Kazutaka Ishigo, Mie (JP); Takaki Kumanomido, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 12/649,477

(22) Filed: Dec. 30, 2009

(65) Prior Publication Data

US 2010/0211352 A1    Aug. 19, 2010

(30) Foreign Application Priority Data

Feb. 17, 2009 (JP) ................. 2009-034329

(51) Int. Cl.
*G01C 9/00* (2006.01)
*G01C 17/00* (2006.01)
*G01C 19/00* (2006.01)

(52) U.S. Cl. ........ 702/150; 702/151; 702/152; 702/153; 702/155; 702/158

(58) Field of Classification Search .......... 702/150–153, 702/155, 158; 438/795
See application file for complete search history.

(56) References Cited

U.S. PATENT DOCUMENTS

| 6,410,927 | B1 * | 6/2002 | Pike ............................ 250/491.1 |
| 7,011,912 | B2 * | 3/2006 | Choi ................................. 430/5 |
| 2009/0121152 | A1 * | 5/2009 | Obara et al. ............. 250/442.11 |
| 2010/0073671 | A1 * | 3/2010 | Chou et al. ................. 356/237.4 |

FOREIGN PATENT DOCUMENTS

| JP | 5-53292 | 3/1993 |
| JP | 11-338123 | 12/1999 |
| JP | 2000-214576 | 8/2000 |
| JP | 2004-157518 | 6/2004 |
| JP | 3753603 | 12/2005 |

* cited by examiner

*Primary Examiner* — Sujoy Kundu
(74) *Attorney, Agent, or Firm* — Finnegan, Henderson, Farabow, Garrett & Dunner, L.L.P.

(57) ABSTRACT

A method of inspecting a mark arrangement according to an embodiment of the present invention includes: generating mask data in which mark seed data that includes an inspection mark that includes vector information and is not drawn on a mask and mark data is arranged on a scribe line of the mask, calculating coordinates of the inspection mark from a reference position of the mark seed data, detecting an arrangement state of the inspection mark with respect to the reference position by using the coordinates and vector information, and judging whether the mark seed data is correctly arranged by comparing the arrangement state of the inspection mark with an arrangement check rule.

19 Claims, 20 Drawing Sheets

FIG.7

(ROTATION DETECTION IS COUNTERCLOCKWISE)

| Y-AXIS MIRRORING | 0° | 90° | 180° | 270° |
|---|---|---|---|---|
| NO (RELATIVE POSITION INFORMATION) | (s, t) | (-t, s) | (-s, -t) | (t, -s) |
| YES (RELATIVE POSITION INFORMATION) | (-s, t) | (t, s) | (s, -t) | (-t, -s) |

FIG.8A

ROTATION ANGLE RULE

| MARK TYPE | ROTATION ANGLE (DEG) | | | | | |
|---|---|---|---|---|---|---|
| | X AXIS | Y AXIS | XD | XU | YR | YL |
| MK_TYPE_1 | 0° | 270° | | | | |
| MK_TYPE_2 | 0° | 90° | | | | |
| MK_TYPE_3 | | | 0° | 180° | 90° | 270° |
| MK_TYPE_4 | | | | | | |

MIRRORING RULE

| MARK TYPE | MIRRORING (PRESENCE/ABSENCE) | | | | | |
|---|---|---|---|---|---|---|
| | X AXIS | Y AXIS | XD | XU | YR | YL |
| MK_TYPE_1 | NO | NO | | | | |
| MK_TYPE_2 | YES | YES | | | | |
| MK_TYPE_3 | | | YES | NO | NO | YES |
| MK_TYPE_4 | | | | | | |

ARRANGEMENT CHECK RULE
CORRESPONDENCE TABLE

| MARK TYPE | BLOCK NAME |
|---|---|
| MK_TYPE_1 | BLK_AA |
| MK_TYPE_1 | BLK_GC1 |
| MK_TYPE_2 | BLK_GC2 |
| | |
| | |
| | |
| | |

| BLOCK NAME | ATTRIBUTE VALUE (LAYER NAME) | COORDI-NATES (FIRST POINT) | ROTA-TION ANGLE | PRESENCE/ABSENCE OF MIRRORING | ARRANG-EMENT AREA | MARK TYPE | JUDGMENT RESULT |
|---|---|---|---|---|---|---|---|
| BLK_AA | AA | x1, y1 | 0° | NO | ON X AXIS | MK_TYPE_1 | OK |
| BLK_AA | AA | x2, y2 | 0° | NO | ON X AXIS | MK_TYPE_1 | OK |
| BLK_AA | AA | x3, y3 | 270° | NO | ON Y AXIS | MK_TYPE_1 | OK |
| BLK_AA | AA | x4, y4 | 270° | NO | ON Y AXIS | MK_TYPE_1 | OK |
| | | | | | | | |
| | | | | | | | |

FIG.13A

| BLOCK NAME | ATTRIBUTE VALUE (LAYER NAME) | COORDI-NATES (FIRST POINT) | ROTA-TION ANGLE | PRESENCE/ ABSENCE OF MIRRORING | ARRANG-EMENT AREA | MARK TYPE | JUDGMENT RESULT |
|---|---|---|---|---|---|---|---|
| BLK_AA | AA | x1, y1 | | | ON X AXIS | MK_TYPE_1 | |
| BLK_AA | AA | x2, y2 | | | ON X AXIS | MK_TYPE_1 | |
| BLK_AA | AA | x3, y3 | | | ON X AXIS | MK_TYPE_1 | |
| BLK_AA | AA | x4, y4 | | | ON X AXIS | MK_TYPE_1 | |

FIG.13B

| BLOCK NAME | ATTRIBUTE VALUE (LAYER NAME) | COORDI-NATES (FIRST POINT) | ROTA-TION ANGLE | PRESENCE/ ABSENCE OF MIRRORING | ARRANG-EMENT AREA | MARK TYPE | JUDGMENT RESULT |
|---|---|---|---|---|---|---|---|
| BLK_AA | AA | x1, y1 | 0° | NO | ON X AXIS | MK_TYPE_1 | |
| BLK_AA | AA | x2, y2 | 0° | NO | ON X AXIS | MK_TYPE_1 | |
| BLK_AA | AA | x3, y3 | 270° | NO | ON X AXIS | MK_TYPE_1 | |
| BLK_AA | AA | x4, y4 | 270° | NO | ON X AXIS | MK_TYPE_1 | |

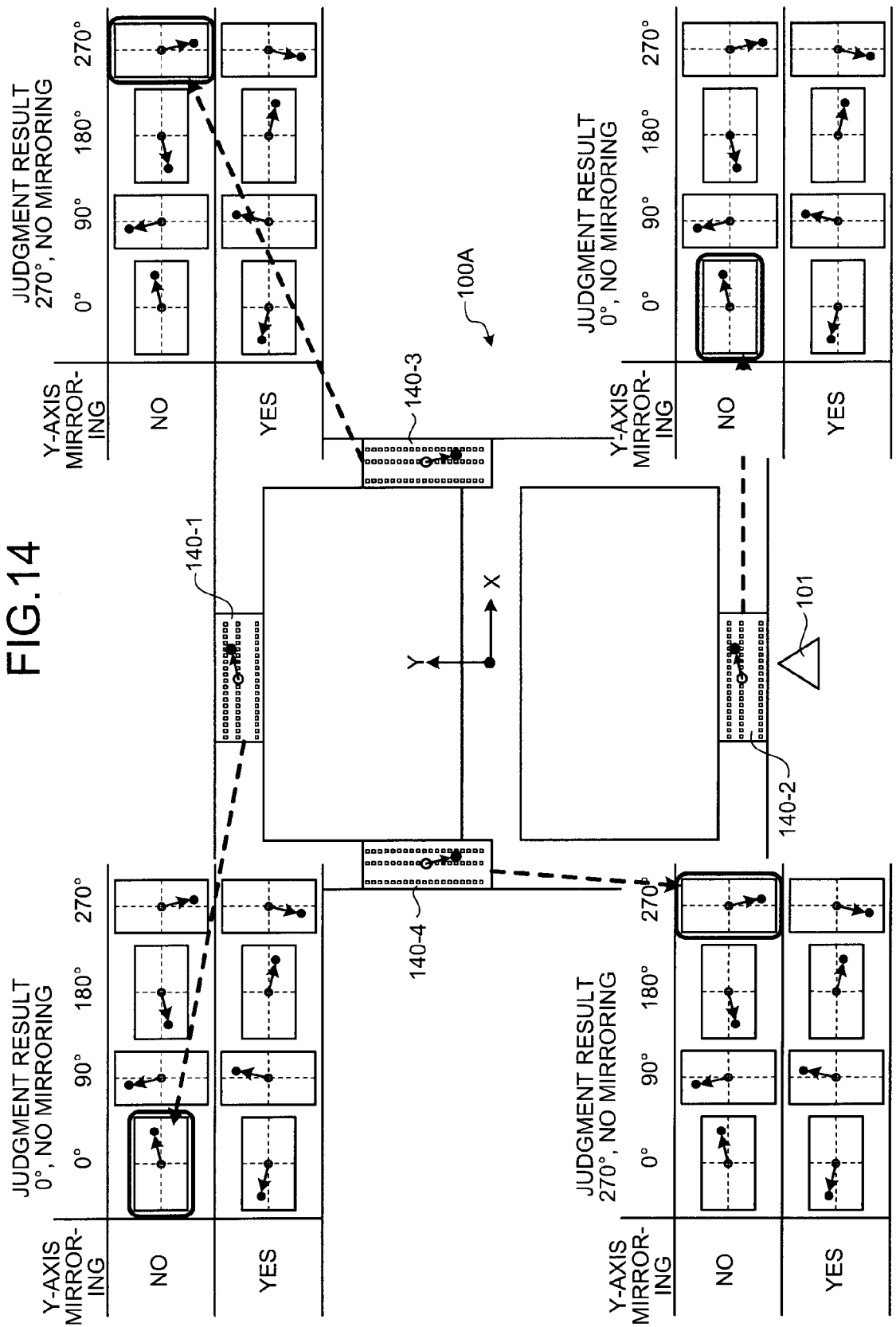

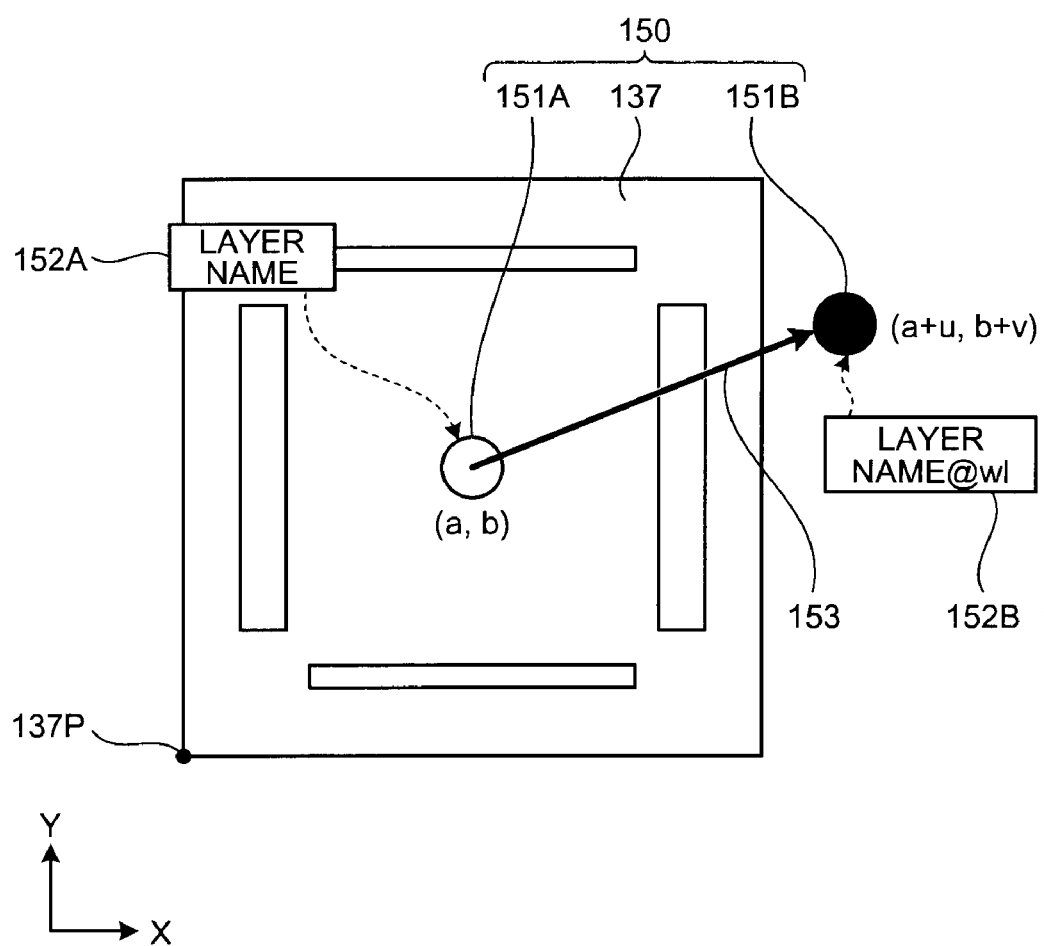

FIG.22A

| BLOCK NAME | ATTRIBUTE VALUE (LAYER NAME) | COORDI-NATES (FIRST POINT) | ROTATION ANGLE WITH REFERENCE TO MASK COORDINATE SYSTEM | MARK ALLOWING WL DIRECTION | WL DIRECTION OF PRODUCT | JUDGMENT RESULT |
|---|---|---|---|---|---|---|
| BLK_AA | AA | x1, y1 | 0° | | HORIZONTAL | |
| BLK_AA | AA | x2, y2 | 0° | | HORIZONTAL | |
| BLK_AA | AA | x3, y3 | 270° | | HORIZONTAL | |
| BLK_AA | AA | x4, y4 | 270° | | HORIZONTAL | |

FIG.22B

| BLOCK NAME | ATTRIBUTE VALUE (LAYER NAME) | COORDI-NATES (FIRST POINT) | ROTATION ANGLE WITH REFERENCE TO MASK COORDINATE SYSTEM | MARK ALLOWING WL DIRECTION | WL DIRECTION OF PRODUCT | JUDGMENT RESULT |
|---|---|---|---|---|---|---|
| BLK_AA | AA | x1, y1 | 0° | HORIZONTAL | HORIZONTAL | |
| BLK_AA | AA | x2, y2 | 0° | HORIZONTAL | HORIZONTAL | |
| BLK_AA | AA | x3, y3 | 180° | HORIZONTAL | HORIZONTAL | |
| BLK_AA | AA | x4, y4 | 180° | HORIZONTAL | HORIZONTAL | |

FIG.22C

| BLOCK NAME | ATTRIBUTE VALUE (LAYER NAME) | COORDI-NATES (FIRST POINT) | ROTATION ANGLE WITH REFERENCE TO MASK COORDINATE SYSTEM | MARK ALLOWING WL DIRECTION | WL DIRECTION OF PRODUCT | JUDGMENT RESULT |
|---|---|---|---|---|---|---|
| BLK_AA | AA | x1, y1 | 0° | HORIZONTAL | HORIZONTAL | OK |
| BLK_AA | AA | x2, y2 | 0° | HORIZONTAL | HORIZONTAL | OK |
| BLK_AA | AA | x3, y3 | 180° | HORIZONTAL | HORIZONTAL | OK |
| BLK_AA | AA | x4, y4 | 180° | HORIZONTAL | HORIZONTAL | OK |

FIG.23
| | (ROTATION DETECTION IS COUNTERCLOCKWISE) | | | |
|---|---|---|---|---|
| INSPECTION MARK ARRANGEMENT POSITION (RELATIVE POSITION INFORMATION) | 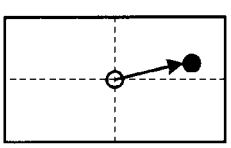 (u, v) | 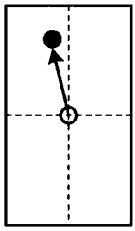 (-v, u) | 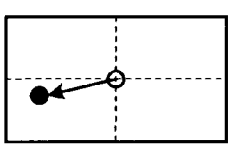 (-u, -v) | 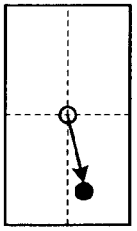 (v, -u) |
| ROTATION ANGLE IN MASK COORDINATE SYSTEM | 0° | 90° | 180° | 270° |
| MARK ALLOWING WORD LINE DIRECTION | HORIZONTAL | VERTICAL | HORIZONTAL | VERTICAL |

# MARK ARRANGEMENT INSPECTING METHOD, MASK DATA, AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2009-34329, filed on Feb. 17, 2009; the entire contents of which are incorporated herein by reference.

BACKGROUND OF THE INVENTION

1. Field of the Invention

The present invention relates to a mark arrangement inspecting method for inspecting whether a mark such as an alignment mark or a measurement mark is arranged on mask data in accordance with a predetermined rule. Moreover, the present invention relates also to mask data that is inspected by the mark arrangement inspecting method. Furthermore, the present invention relates also to a manufacturing method of a semiconductor device that is manufactured by using the mark generated based on the mask data that is inspected by the mark arrangement inspecting method.

2. Description of the Related Art

In manufacturing a semiconductor device, a pattern is formed by a photomask in a predetermined area for each process such as introduction of impurities, formation of a contact hole/via hole, and formation of a wiring pattern to perform the process. At this time, an alignment mark for positioning for ensuring a relative position between respective processes and a measurement mark for inspecting a displacement or a process result are arranged on scribe lines of a photomask.

Conventionally, photomask data is generated by using a computer-aided design (CAD) in the following manner (for example, see Japanese Patent Application Laid-open No. 2004-157518). First, a design technology such as a design rule conforming to a device, an operational frequency, and the like to be used and a suitable process technology are determined, and thereafter, logical design, layout design, and design verification are performed, whereby chip data of a semiconductor device part is generated. Then, after the layout design of the semiconductor device is completed, a chip size, the number of impositions on the photomask, and the like are determined, and type information is determined, the alignment mark and the measurement mark conforming to a mark specification necessary for each process technology or each manufacturing equipment are generated, and an arrangement process of the alignment mark and the measurement mark on scribe lines including the verification of a positional relationship between photomasks used in pre- and post-processing is performed, whereby scribe line data is formed.

The number of the alignment marks and the measurement marks arranged on the scribe lines in this manner is as many as 1500 or more per product. Moreover, some alignment marks and measurement marks depend on a notch direction of a semiconductor wafer or a direction of a word line in a semiconductor cell formed on the semiconductor wafer. In other words, the arrangement direction of some alignment marks and measurement marks are determined in a predetermined direction. Therefore, conventionally, after designing the scribe line data, the alignment marks and the measurement marks are visually checked. However, there arises a problem that incorrect arrangement of the alignment marks and the measurement marks is missed with high possibility because, for example, the number of the alignment marks and the measurement marks as a check target is large and it is difficult to visually find an error. Moreover, human resources for the visual inspection cannot be ignored. Furthermore, once the arrangement error of the alignment mark is missed, a mask with which exposure and inspection cannot be performed is manufactured and a mask may need to be refined (reproduced) in the worst case, which adversely affects the turn-around time (TAT) and the manufacturing cost of the semiconductor device.

BRIEF SUMMARY OF THE INVENTION

A method of inspecting a mark arrangement for inspecting an arrangement state of mark data corresponding to a mark in mask data for manufacturing a mask including the mark for alignment or measurement formed on a scribe line of a process target according to an embodiment of the present invention, the method comprises: generating mark seed data that includes an inspection mark that includes vector information for detecting a rotation in units of a predetermined angle or a mirroring of the mark and that is not drawn on the mask, and the mark data; generating the mask data in which the mark seed data is arranged on the scribe line of the mask; calculating coordinates of the inspection mark from a reference position set to the mask data for each of the mark seed data in the mask data; detecting an arrangement state of the inspection mark with respect to the reference position by using calculated coordinates and the vector information on the inspection mark; and judging whether the mark seed data is correctly arranged on the scribe line by comparing the arrangement state of the inspection mark with an arrangement check rule that defines an arrangement state of the mark seed data on the mask.

A mask data according to an embodiment of the present invention that includes chip data and scribe line data formed around the chip data, wherein the scribe line data includes mark seed data that includes mark data that is a pattern of a mark for alignment or measurement and an inspection mark that includes vector information for detecting a rotation of the mark data in units of a predetermined angle of the mark data and is not drawn on a mask.

A method of manufacturing a semiconductor device according to an embodiment of the present invention comprises: generating mark seed data that includes an inspection mark that includes vector information for detecting a rotation in units of a predetermined angle or a mirroring of the mark and that is not drawn on the mask and the mark data; generating mask data in which the mark seed data is arranged on a scribe line of the mask; calculating coordinates of the inspection mark from a reference position set to the mask data for each of the mark seed data in the mask data; detecting an arrangement state of the inspection mark with respect to the reference position by using calculated coordinates and the vector information on the inspection mark; judging whether the mark seed data is correctly arranged on the scribe line by comparing the arrangement state of the inspection mark with an arrangement check rule that defines an arrangement state of the mark seed data on the mask; and thereafter exposing a resist that is applied on a process target by using a mask on which a pattern of a chip body and a pattern of a mark on a scribe line are formed on a transparent substrate and processing the process target by using the pattern obtained by developing the resist, based on the mask data in which the mark seed data is correctly arranged.

BRIEF DESCRIPTION OF THE DRAWINGS

FIG. 7 is a diagram illustrating an example of correspondence information between a relative position and an arrangement state;

FIGS. 8A to 8C are diagrams illustrating an example of an inspection-mark arrangement check rule;

FIGS. 13A and 13B are diagrams illustrating an example of the arrangement check information;

FIG. 14 is a diagram schematically illustrating a calculation process of the arrangement information;

FIG. 17 is a diagram illustrating an example of an inspection mark according to a second embodiment;

FIGS. 22A to 22C are diagrams illustrating an example of arrangement check information; and FIG. 23 is a diagram illustrating an example of correspondence information between a rotation angle and a word line direction.

DETAILED DESCRIPTION OF THE INVENTION

A mark arrangement inspecting method, mask data, and a manufacturing method of a semiconductor device according to embodiments of the present invention are explained in detail below with reference to the accompanying drawings. The present invention is not limited to the embodiments. The mark arrangement inspecting method and a mark are explained below taking the case of manufacturing a semiconductor device as an example.

(First Embodiment)

In the first embodiment, explanation is given for the mark arrangement inspecting method for inspecting whether data (mark data) of a mark such as an alignment mark or a measurement mark is rotated/mirrored (hereinafter, "mirroring" in some cases) in accordance with a predetermined arrangement rule with respect to a Cartesian coordinate system when the Cartesian coordinate system having an X axis and a Y axis that are orthogonal to each other according to a predetermined rule with respect to a notch (a notch portion of a semiconductor wafer) as a direction specifying portion for a process target is set to mask data, and a mark.

Before explaining the present embodiment, an outline of mask data and scribe line data are explained. In manufacturing a semiconductor device, a mask is used in each process, and the mask is provided with a pattern of a chip body and scribe lines formed around the pattern of the chip body. On the scribe line, a mark such as an alignment mark for positioning for ensuring a relative position between respective processes and a measurement-mark for inspecting a displacement or a process result is arranged. Data for generating a photomask is the mask data, which is generated by a CAD or the like. A different photomask is used for each layered process (each layer). The photomask based on the mask data is manufactured by the following method. A photosensitive material such as a photoresist is applied on a transparent substrate such as a quartz substrate or a resin film on which a light shielding film such as a chrome is formed and which transmits light and a pattern based on the mask data is drawn on the photosensitive material by a drawing device that utilizes a laser or an electron beam to perform exposure. Thereafter, the photosensitive material is developed, the light shielding film is etched with the pattern formed by the developed photosensitive material as a mask, and the photosensitive material is removed from the transparent substrate, whereby the photomask is generated.

Figure 1:
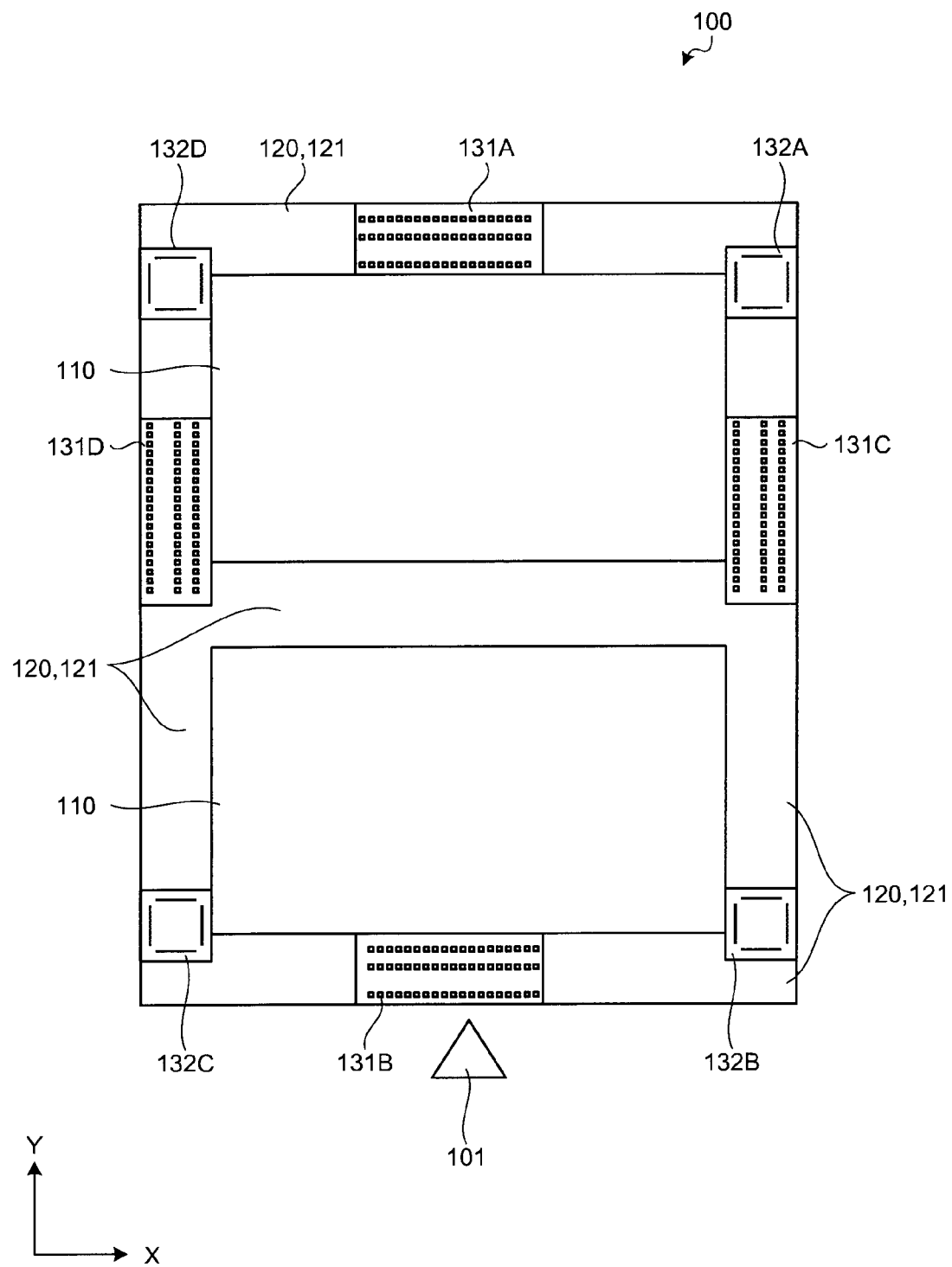
FIG. 1 is a diagram illustrating an example of mask data.

FIG. 1 is a diagram illustrating an example of the mask data. The mask data shown in FIG. 1 illustrates a state of being displayed on an information processing apparatus such as a CAD, and the same can be said to the following drawings. Mask data 100 includes chip data 110 in which a pattern of a chip body is formed and scribe line data 120 formed around the chip data 110. The scribe line data 120 is also called dicing line data, nest data, or kerf data, and is used as a cut line for carving chips in the dicing process after the wafer process is completed. The scribe line data 120 is, for example, formed by arranging the mark data that is a pattern of a mark generated based on coordinates and an area of the chip data 110, the shape formed in consideration of a process execution condition thereof, and the like on a scribe line 121. Examples of the mark include various marks such as the alignment mark or the measurement mark that are not related to an electrical operation of a chip and is used only in the wafer manufacturing and a test element group (TEG). In FIG. 1, mark data 131A to 131D indicate the mark data for the alignment mark, and mark data 132A to 132D indicate the mark data for the measurement mark.

As described above, the arrangement of the mark data is determined with respect the X axis and the Y axis set in predetermined directions by reference to a notch 101 arranged in a wafer. In FIG. 1, the X axis is provided in a right and left direction and the Y axis direction is provided in an up and down direction vertical to the X axis when the notch 101 is arranged in a downward direction. The scribe lines 121 are provided in directions parallel to the X-axis direction and the Y-axis direction.

Figure 2A:
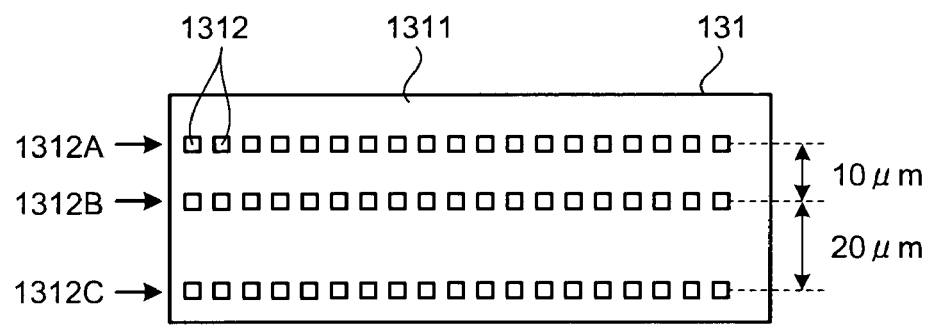
FIGS. 2A to 2C are diagrams illustrating an example of mark data.
Figure 2B:
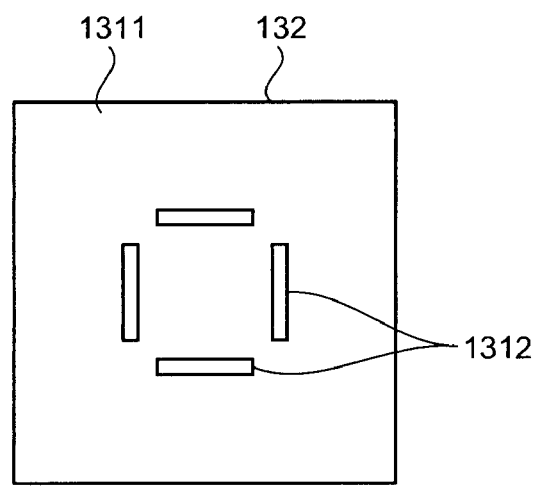
Figure 2C:
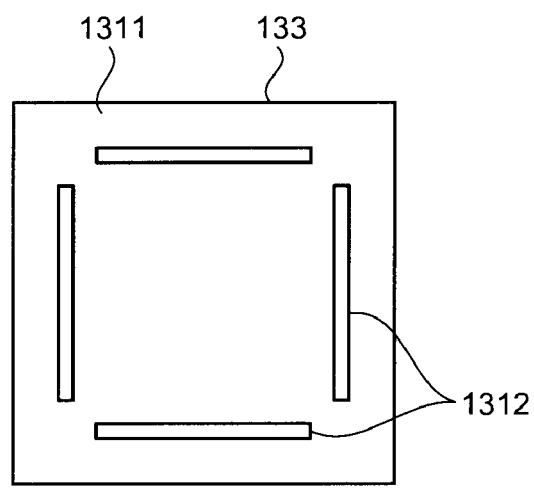

FIGS. 2A to 2C are diagrams illustrating an example of the mark data. In mark data 131 shown in FIG. 2A, a pattern is illustrated in which square light transmitting portions 1312 are provided according to a predetermined rule in a rectangular mark forming area in which a light shielding portion 1311 is formed entirely. In FIG. 2A, three light transmitting portion rows 1312A to 1312C in each of which the light transmitting portions 1312 are linearly arranged are formed in parallel with each other, and the interval between the light transmitting portion rows 1312A and 1312B is different from the interval between the light transmitting portion rows 1312B and 1312C. The mark data 131 shown in FIG. 2A is the mark data on a mark that is used in positioning (alignment) between a process target and a mask in the photolithography process.

In mark data 132 shown in FIG. 2B, a pattern is illustrated in which the linear light transmitting portions 1312 with a predetermined length are arranged parallel to respective sides in a square mark forming area in which the light shielding portion 1311 is formed entirely. In mark data 133 shown in FIG. 2C, a pattern is illustrated in which the linear light transmitting portions 1312 with a length longer than the light transmitting portions 1312 shown in FIG. 2B are arranged parallel to respective sides and outer side of the position of the light transmitting portions 1312 shown in FIG. 2B in a square mark forming area in which the light shielding portion 1311 is formed entirely. The mark data 132 and 133 shown in FIG. 2B and FIG. 2C are the mark data for the measurement mark. For example, the mark data 132 shown in FIG. 2B is used as a mask for forming a first layer, the mark data 133 shown in FIG. 2C is used as a mask for forming a second layer on the first layer, and a distance between the pattern corresponding to the light transmitting portions 1312 of the mark data 132 transferred onto the first layer and the pattern corresponding to the light transmitting portions 1312 of the mark data 133 transferred onto the second layer is measured, to be used for detecting a displacement from a desired position.

In FIG. 2A to FIG. 2C, the patterns of the light shielding portion 1311 and the light transmitting portions 1312 can be switched. These mark data are designed based on a specification (including an illumination shape) determined in a manufacturing apparatus or an inspection apparatus to be used.

The mark data is arranged not to protrude outside the scribe line 121, and the arrangement angle, the direction, and the like of the mark data with respect to the X axis (or the Y axis) arranged on the mask data are different in some cases at a different position on the mask data in each layer (process).

For example, the mark data 131A and 131B arranged on the scribe lines 121 that are parallel to the X axis direction in FIG. 1 are arranged as in the state shown in FIG. 2A, and the mark data 131C and 131D arranged on the scribe lines 121 that are parallel to the Y axis direction in FIG. 1 are arranged as in the state in which FIG. 2A is rotated by 270° counterclockwise. Moreover, although it is not shown, the mark data is mirrored and arranged in some cases. In this manner, the mark data is rotated or mirrored to be arranged on the scribe lines 121. On the other hand, the mark data 132A to 132D are arranged as in the state shown in FIG. 2C on the scribe lines 121. This is because the mark data 132 and 133 shown in FIG. 2B and FIG. 2C each has a four-fold symmetry about the center of the mark data and therefore there is no difference in the arrangement angle and the direction with respect to the X axis and the Y axis depending on the arrangement position.

After finishing generating the mask data in such a manner, it is checked whether data for a mask arranged in the mask data is arranged in accordance with a predetermined arrangement rule for each mask (process). In the check operation, conventionally, an operator visually checks the arrangement of the data for the mask. In the first embodiment, the check operation is performed on an apparatus by using mark seed data in which an inspection mark on design data with which the presence or absence of the rotation and the mirroring of the mark data can be identified and which is not drawn on a mask is set in the mark data. Then, the direction of the inspection mark of the mark seed data in the mask data of each layer (process) is compared with an arrangement check rule set in each layer (process) to inspect whether the arrangement of the mark seed data is performed in accordance with the arrangement check rule. The mark arrangement inspecting method and the mark seed data according to the first embodiment are explained in detail below.

Figure 3:
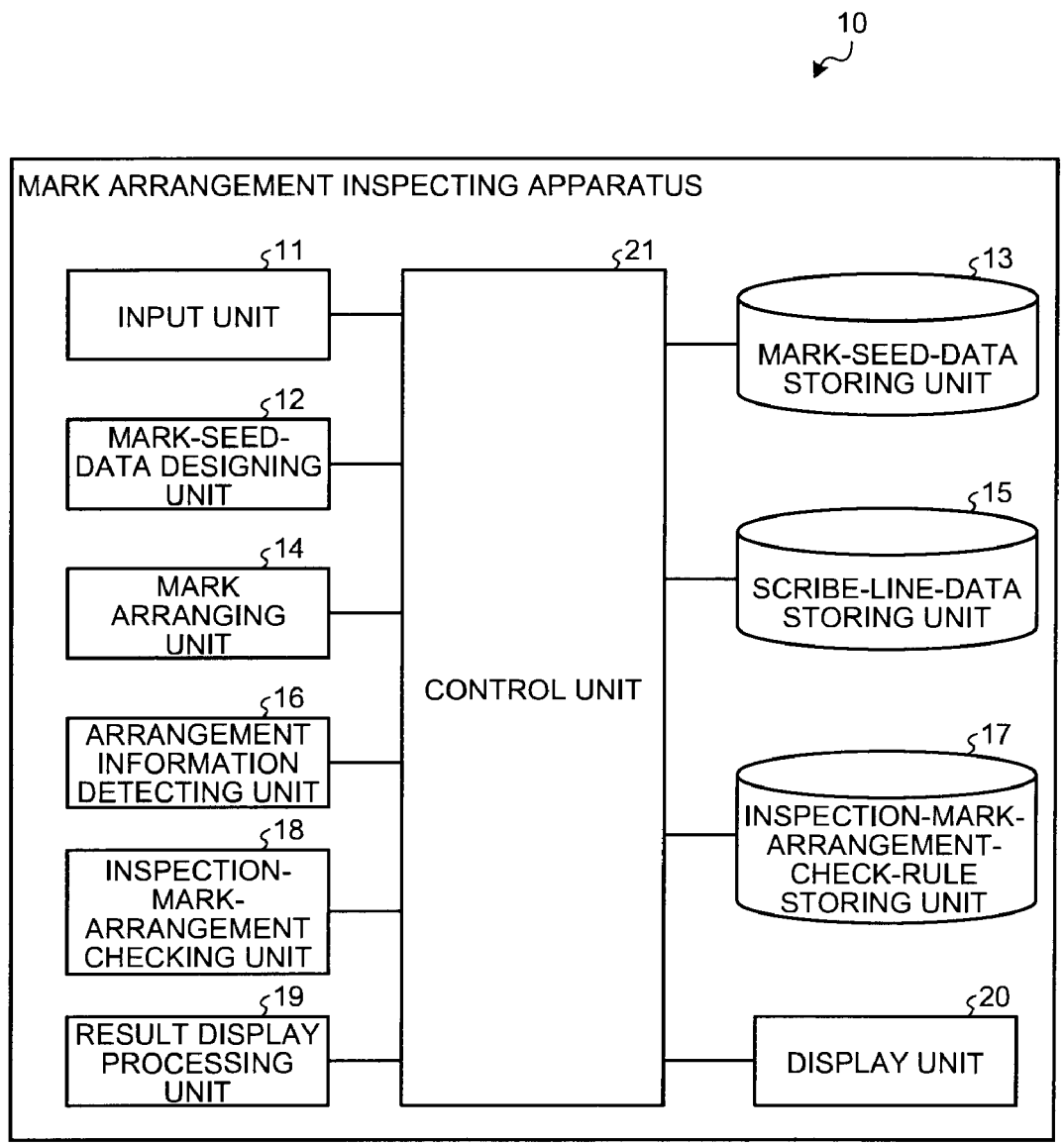
FIG. 3 is a block diagram schematically illustrating an example of a configuration of a mark arrangement inspecting apparatus according to a first embodiment of the present invention.

FIG. 3 is a block diagram schematically illustrating an example of a configuration of a mark arrangement inspecting apparatus according to the first embodiment of the present invention. A mark arrangement inspecting apparatus 10 includes an input unit 11, a mark-seed-data designing unit 12, a mark-seed-data storing unit 13, a mark arranging unit 14, a scribe-line-data storing unit 15, an arrangement information detecting unit 16, an inspection-mark-arrangement-check-rule storing unit 17, an inspection-mark-arrangement checking unit 18, a result display processing unit 19, a display unit 20, and a control unit 21 that controls each processing unit of the above units.

The input unit 11 is an input device such as a keyboard and a pointing device (e.g., a mouse), and is an input interface for information about a mask data generation from a user. For example, a user inputs from the input unit 11 information such as design information on a mark such as the alignment mark and the measurement mark, attribute information set to the mark seed data, and the mark arrangement check rule.

The mark-seed-data designing unit 12 generates the mark seed data in which the inspection mark, with which it is possible to check whether the mark data is correctly arranged by the following mark data arrangement process in accordance with the arrangement check rule, is set in a single piece of the mark data that is used in each process and is designed by a user. As shown in FIG. 2A to FIG. 2C as an example, the mark data includes the pattern in which the light transmitting portions 1312 are arranged according to a predetermined rule on the light shielding portion 1311 or the pattern in which the light shielding portion is arranged according to a predetermined rule on the light transmitting portions. The inspection mark is data that includes information (hereinafter, "vector information" in some cases meaning a direction including the mirroring), with which the rotation direction and the presence or absence and the mirroring of the mark data arranged on a scribe line can be detected, and that is present on design data (CAD data) but is not drawn on a mask.

Figure 4:
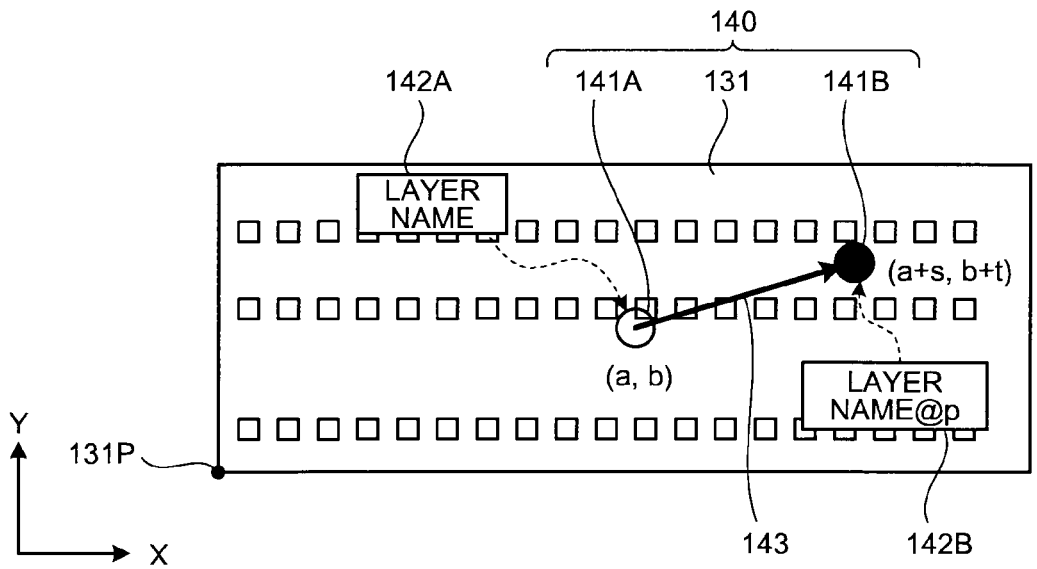
FIG. 4 is a diagram illustrating an example of an inspection mark according to the first embodiment.

FIG. 4 is a diagram illustrating an example of the inspection mark according to the first embodiment. An example is given for the case where two points 141A and 141B are arranged as the inspection mark on the mark data 131 shown in FIG. 2A to form mark seed data 140. A right and left direction in FIG. 4 is defined as the X axis and a direction vertical to the X axis direction on the drawing sheet is defined as the Y axis with a corner 131P of the lower left of the mark data 131 as the origin in FIG. 4. As shown in FIG. 4, the first point 141A is a mark reference point, and a relative position in the mark that is determined as a specification in an exposing apparatus or an alignment inspection apparatus that utilizes the mark (the mark seed data 140) is used as the first point 141A. Typically, the coordinates of the first point 141A are input in a recipe of an apparatus after the mark seed data 140 is arranged on a scribe line and are often the center (center of gravity) of the mark seed data 140. The first point 141A also includes attribute information 142A such as a character string. In this case, a layer name (process name) in which the first point 141A is arranged is set as the attribute information 142A. Consequently, the position of the first point 141A is (a, b) and the "layer name" is set as the attribute information 142A.

The second point 141B is a point that is arranged at a position shifted by a predetermined distance from the first point 141A in the X axis direction and the Y axis direction. For example, the second point 141B is arranged at a position that is shifted by a distance s in the X axis direction and by a distance t in the Y axis direction with respect to the first point 141A. The values s and t are fixed values. The second point 141B also includes attribute information 142B that is obtained by adding information for identification of the second point 141B to the attribute value of the first point 141A. In this case, the attribute information 142B of the second point 141B is expressed as "(first point attribute value)+@p". Therefore, the position of the second point 141B is (a+s, b+t) and the attribute information 142B is "layer name @p".

In the following drawings, for easily visually distinguishing between the first point 141A and the second point 141B, an arrow 143 that is directed from the first point 141A to the second point 141B is drawn together. In order to judge the rotation direction and the presence or absence of the mirroring of the mark data 131 by only the two points of the first point 141A and the second point 141B, it is needed to satisfy the conditions of $|s| \neq |t|$, $s \neq 0$, and $t \neq 0$. Moreover, for the mark data (for example, the mark data 132 and 133 shown in FIG. 2B and FIG. 2C) that is not needed to judge the rotation and the presence or absence of the mirroring, the second point 141B does not need to be arranged as the inspection mark. However, as described above, the first point 141A is needed for a recipe of an exposing apparatus or an alignment inspection apparatus, so that the first point 141A is necessarily arranged.

Figure 5:
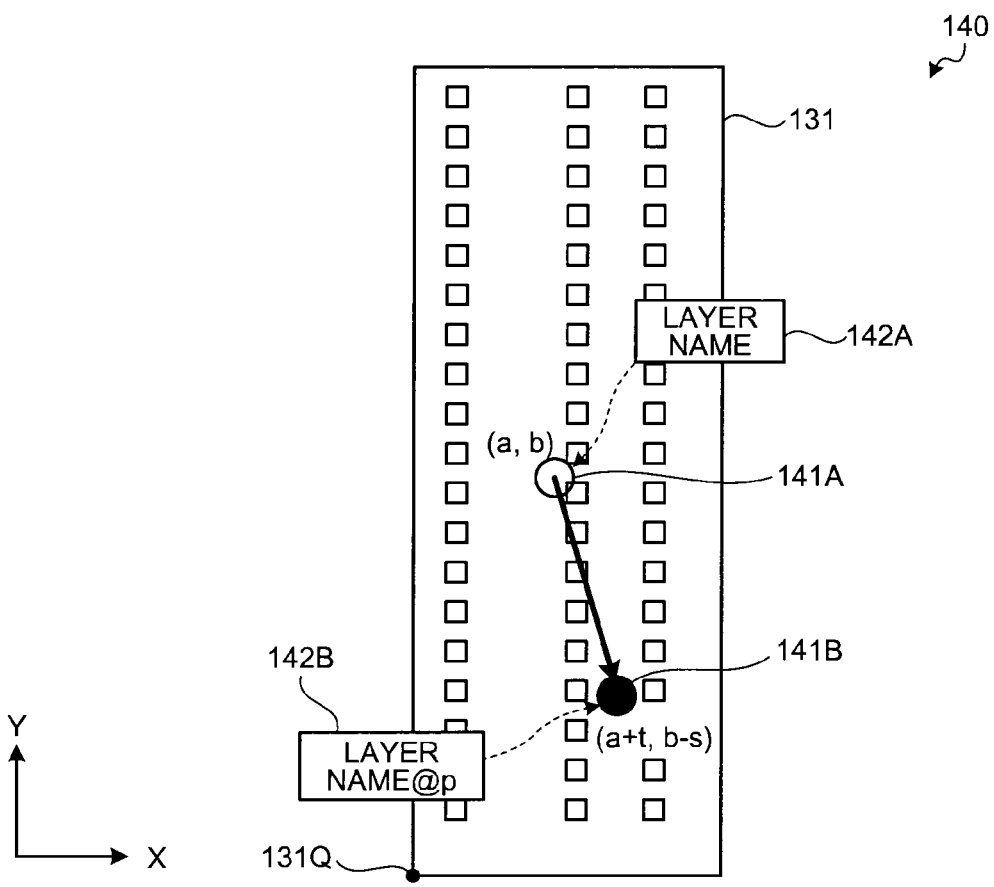
FIG. 5 is a diagram illustrating another example of the inspection mark.

FIG. 5 is a diagram illustrating another example of the inspection mark. FIG. 5 illustrates a case in which the mark seed data 140 is designed in a state of being rotated by 270° counterclockwise with respect to FIG. 4. Specifically, a right and left direction in FIG. 5 is defined as the X axis and a direction vertical to the X axis direction on the drawing sheet is defined as the Y axis with a corner 131Q of the lower left of the mark data 131 as the origin in FIG. 5. When the mark data 131 is rotated and designed, the fixed values s and t are also rotated according to the rotation of the mark data 131.

For example, in the case shown in FIG. 5, the second point 141B is arranged at the position that is shifted by the distance t in the X axis direction and by the distance −s in the Y axis direction with respect to the first point 141A. Consequently, the position of the first point 141A is (a, b) and the position of the second point 141B is (a+t, b−s).

As described above, the mark-seed-data designing unit 12 performs a process of generating the mark seed data 140 in which the first point 141A and the second point 141B each including the attribute information is provided as data on design data that is not practically drawn in the mark data used in each designed layer. Then, a block name with which the generated mark seed data 140 can be uniquely identified is added to be stored in the mark-seed-data storing unit 13. In this case, the mark seed data 140 is generated with the block name as "BLK_(layer name)".

The mark-seed-data storing unit 13 stores therein the mark seed data used in each layer while adding thereto the block name with which the mark seed data can be uniquely identified.

The mark arranging unit 14 arranges the mark seed data 140 stored in the mark-seed-data storing unit 13 on a scribe line of the mask data and generates the scribe line data. The scribe line data can be generated by arranging the mark seed data 140 on the scribe line by an operation by a user from the input unit 11 or can be generated by generating in advance a mark-seed-data arrangement rule that determines a layer and a position thereof to arrange the mark seed data 140 and automatically arranging the mark seed data 140 in accordance with the mark-type arrangement rule. The mark seed data 140 is rotated or mirrored depending on the position to be arranged not to protrude outside the scribe line. On the scribe line, a plurality of pieces of the mark seed data 140 stored in the mark-seed-data storing unit 13 is arranged in some cases. At this time, the mark seed data 140 is arranged with reference to the Cartesian coordinate system provided with respect to the notch. Then, information on the mark seed data 140 arranged on the scribe line is stored in the scribe-line-data storing unit 15 as scribe line data.

Figure 6:
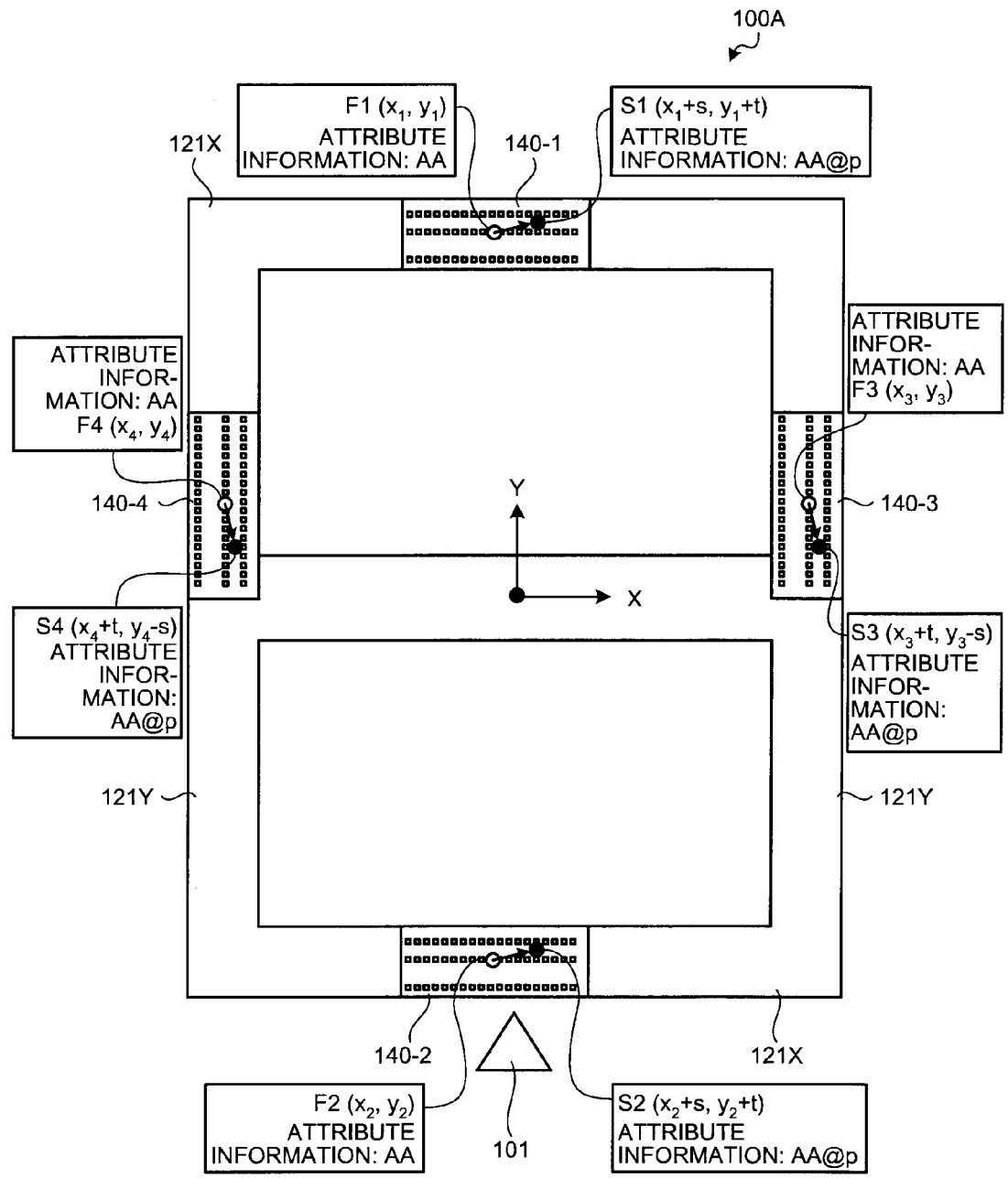
FIG. 6 is a diagram illustrating an example of an arrangement of mark seed data.

FIG. 6 is a diagram illustrating an example of the arrangement of the mark seed data. In FIG. 6, the Cartesian coordinate system in which a right and left direction is the X axis and an up and down direction is the Y axis when the notch 101 is arranged on the lower side is arranged in mask data 100A so that the center (center of gravity) of the mask data 100A is the origin. On a scribe line 121X in a direction parallel to the X axis, mark seed data 140-1 and 140-2 having an arrangement state same as FIG. 4 are arranged, and on a scribe line 121Y in a direction parallel to the Y axis, mark seed data 140-3 and 140-4 having an arrangement state same as FIG. 5 that is rotated by 270° counterclockwise from FIG. 4 are arranged.

The scribe-line-data storing unit 15 stores therein the scribe line data in each layer. For example, the scribe line data (mask data) is stored while being correlated with the layer name in which the scribe line data (mask data) is used.

The arrangement information detecting unit 16 performs a process of extracting the coordinates of the inspection mark as design data, which is not drawn, of the mark seed data arranged in the mask data from the mask data in which the scribe line data is generated in the coordinate system of a mask and obtaining arrangement information including the rotation angle and the presence or absence of the mirroring of the inspection mark. For example, in the case of FIG. 6, the coordinate system of the mask coincides with the above XY Cartesian coordinate system. Then, the arrangement information detecting unit 16 extracts the coordinates of first points F1 to F4 and second points S1 to S4 of the mark seed data 140-1 to 140-4 in the coordinate system of the mask. The coordinates of the first point F1 to F4 and the coordinates of the second points S1 to S4 can be judged by judging whether the attribute information thereof includes "@p".

Specifically, the arrangement information detecting unit 16 calculates the relative position information (vector information) of the two points with reference to the first point in the coordinate system of the mask. The relative position information is defined as ((X coordinate of the second point)-(X coordinate of the first point), (Y coordinate of the second point)-(Y coordinate of the first point)).

FIG. 7 is a diagram illustrating an example of correspondence information between the relative position and the arrangement state. Regarding the rotation angle, cases are shown in which the arrangement direction as a reference of the mark seed data is rotated by 90°, 180°, and 270° counterclockwise, and regarding the mirroring, the mark seed data is mirrored in the Y-axis direction in the state of the respective rotation angles. The arrangement direction (arrangement state) as a reference of the mark seed data is a state shown in FIG. 4.

As described above, when the mark seed data as a reference is not mirrored and has a rotation angle of 0°, the first point is shifted by s in the X-axis direction and by t in the Y-axis direction (s≠t, s≠0, t≠0). Therefore, the relative position information on the cases of the rotation angles 0°, 90°, 180°, and 270° with respect to the reference position with no mirroring with respect to the Y-axis direction is (s, t), (−t, s), (−s, −t), and (t, −s), respectively. The relative position information on the cases of the rotation angles 0°, 90°, 180°, and 270° with respect to the reference position with the mirroring with respect to the Y-axis direction is (−s, t), (t, s), (s, −t), and (−t, −s), respectively.

In this manner, the relative position information corresponds to the combination of the presence or absence of the mirroring and the rotation angle on a one-on-one basis, so that the arrangement information detecting unit 16 can obtain the arrangement information including the presence or absence of the mirroring and the rotation angle by using the correspondence information between the relative position and the arrangement state from the obtained relative position information.

The inspection-mark-arrangement-check-rule storing unit 17 stores therein the arrangement check rule defining the presence or absence of the mirroring and the rotation direction when the mark seed data is arranged on the X axis or the Y axis with the inspection mark in the mask data of each layer (process). FIGS. 8A to 8C are diagrams illustrating an example of the inspection-mark arrangement check rule. In this example, the inspection-mark arrangement check rule includes a rotation angle rule shown in FIG. 8A that defines a rule about the rotation angle, a mirroring rule shown in FIG. 8B that defines the presence or absence of the mirroring with respect to the Y axis, and an arrangement-check-rule correspondence table shown in FIG. 8C illustrating a correspondence relationship with the block name to which each rule is applied.

Figures 9, 10:
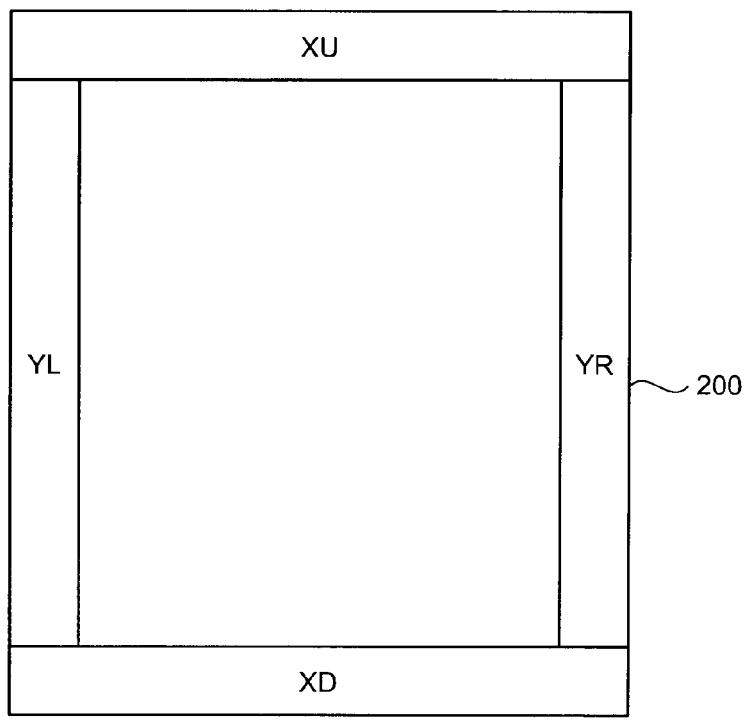
FIG. 9 is a diagram illustrating an example of a definition of each axis in the mask data.
FIG. 10 is a diagram illustrating an example of arrangement check information.

As shown in FIG. 8A, the rotation angle rule includes a mark type with which the arrangement check rule is uniquely identified and items indicating the rotation angle from the arrangement state as a reference of the mark seed data on the X axis and the Y axis. The item "X axis" indicates the rotation angle on a scribe line parallel to the X axis, and the item "Y axis" indicates the rotation angle on a scribe line parallel to the Y axis. FIG. 9 is a diagram illustrating an example of a definition of each axis in the mask data. In the mask data, scribe lines are formed on the peripheral portion of a shot area 200, the scribe line arranged on the upper side is defined as XU and the scribe line arranged on the lower side is defined as XD among the scribe lines parallel to the X axis, and the scribe line arranged on the right side is defined as YR and the scribe line arranged on the left side is defined as YL among the scribe lines parallel to the Y axis. With this definition, when the arrangement of the mark seed data is changed depending on the place, the value of the rotation angle is not input to the items of the X axis and the Y axis but is input to each of the axes of XU, XD, YR, and YL.

The mirroring rule shown in FIG. 8B is the same as the rotation angle rule; however, the presence or absence of the mirroring in each axis is defined with respect to the mark type. In these examples, the axes of XU, XD, YR, and YL are defined in addition to the X axis and the Y axis; however, it is not limited thereto. An arbitrary axis can be set at a position corresponding to a scribe line.

No value is set in a record 300 in which the mark type is specified as "MK_TYPE_4" in FIG. 8A and FIG. 8B, which is the arrangement check rule applied when the mark seed data independent of the arrangement direction is arranged. Because the mark seed data to be arranged does not have a directional property, no value is set to the axes of XU, XD, YR, and YL in addition to the X axis and the Y axis.

The arrangement-check-rule correspondence table shown in FIG. 8C illustrates the block name of a layer to which the mark type indicating the type of the arrangement check rule is applied. As shown in FIG. 8C, one mark type can correspond to a plurality of block names.

The inspection-mark-arrangement checking unit 18 compares the arrangement information detected by the arrangement information detecting unit 16 with the inspection-mark arrangement check rule stored in the inspection-mark-arrangement-check-rule storing unit 17 and judges whether the arrangement information follows the inspection-mark arrangement check rule. When the inspection-mark arrangement check rule in which a vale is not set for the rotation angle rule and the mirroring rule as the record 300 shown in FIGS. 8A and 8B is selected, it is judged that the detected arrangement information is correctly arranged.

The result display processing unit 19 displays the check result judged by the inspection-mark-arrangement checking unit 18 on the display unit 20. FIG. 10 is a diagram illustrating an example of arrangement check information. The arrangement check information includes items including a "block name" as a judging target, an "attribute value" indicating the layer name (process name) of the mark seed data specified by the block name, a "first point coordinates" indicating a mark seed data position, a "rotation angle" and a "presence or absence of mirroring" obtained for the mark seed data specified by the "block name", the "attribute value", and the "first point coordinates", an "arrangement area" indicating an area on a scribe line on which the mark seed data is arranged, a "mark type" indicating the arrangement check rule to be applied, and a "judgment result" indicating the result whether the arrangement information follows the arrangement check rule. The "block name", the "attribute value", the "first point coordinates", the "rotation angle", the "presence or absence of mirroring", the "arrangement area", and the "mark type" are obtained, for example, by the arrangement information detecting unit 16 after the mark seed data is arranged. The "mark type" is obtained from the arrangement-check-rule correspondence table shown in FIG. 8C of the inspection-mark arrangement check rule applied to the block name.

The display unit 20 includes a display unit such as a liquid crystal display device, and displays the judgment result by the result display processing unit 19 and shows necessary information to a user.

Figure 11:
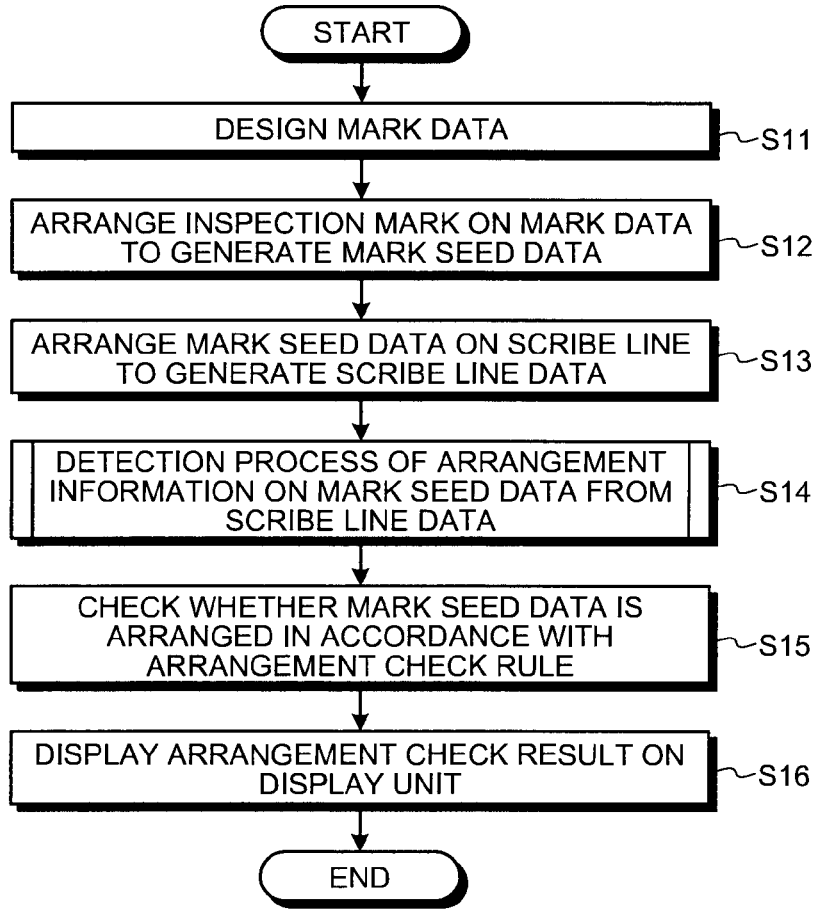
FIG. 11 is a flowchart illustrating an example of a process procedure of a mark arrangement inspecting method.

Next, the process procedure of the mark arrangement inspecting method by the mark arrangement inspecting apparatus 10 having such a configuration is explained with a specific example. FIG. 11 is a flowchart illustrating an example of the process procedure of the mark arrangement inspecting method. First, the mark data used in each layer (process) is designed (Step S11). This designing is performed, for example, by a user inputting information including predetermined shape and pattern from the input unit 11. An example of the mark data is shown in FIG. 2A to FIG. 2C.

Next, when mark data is input, the mark-seed-data designing unit 12 arranges the inspection mark to the mark data (Step S12). As the inspection mark, as shown in FIG. 4, the first point 141A as a reference point and the second point 141B that is shifted by s in the X-axis direction and is shifted by t in the Y-axis direction from the first point 141A is generated, the attribute information 142A including the layer name is set to the first point 141A, and the attribute information 142B including an "attribute information on the first point+@p" is set to the second point 141B. This inspection mark is data that is present only on design data and is not drawn at the time of the mask manufacturing. Then, the mark-seed-data designing unit 12 stores the mark data to which the inspection mark is set in the mark-seed-data storing unit 13 as the mark seed data 140.

Next, the mark seed data 140 is arranged on a scribe line of each layer by using the mark seed data 140 stored in the mark-seed-data storing unit 13 to generate the scribe line data (Step S13). The arrangement of the mark seed data 140 can be performed by a user via the input unit 11 or can be performed automatically by the mark arranging unit 14 in accordance with the preset mark-seed-data arrangement rule. The generated scribe line data is stored in the scribe-line-data storing unit 15. The mask data is generated by the arrangement of the scribe line data. FIG. 6 illustrates one example of the mask data generated in this process. In FIG. 6, only the mark seed data 140 shown in FIG. 4 is arranged on the scribe lines 121X and 121Y of the mask.

Thereafter, the arrangement information detecting unit 16 reads the scribe line data stored in the scribe-line-data storing unit 15 and performs detection of the arrangement information on the mark seed data 140 by using the inspection mark included in the mark seed data 140 (Step S14).

Figure 12:
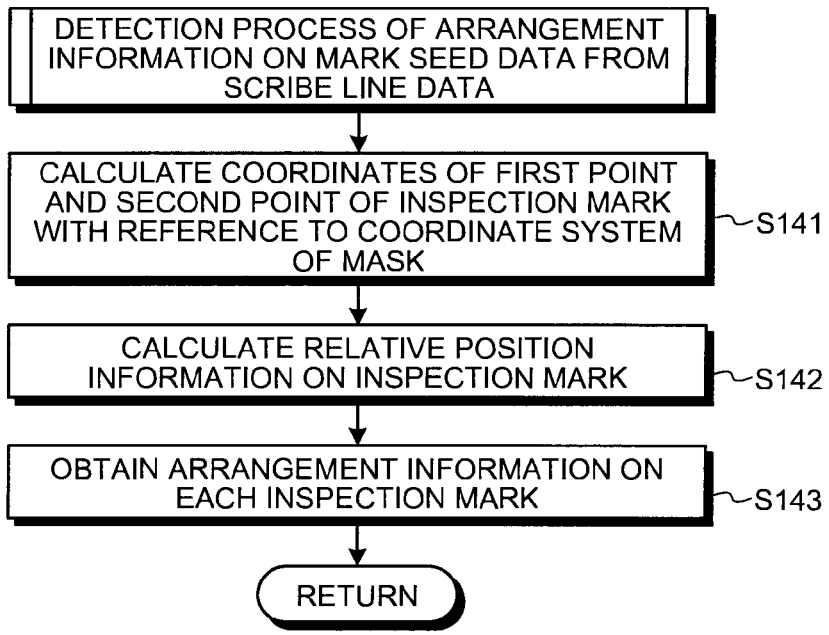
FIG. 12 is a flowchart illustrating an example of a procedure of a detection process of arrangement information on the mark seed data.

The specific process thereof is explained. FIG. 12 is a flowchart illustrating an example of a procedure of the detection process of the arrangement information on the mark seed data. First, the arrangement information detecting unit 16 reads the scribe line data on the mask data of a layer from the scribe-line-data storing unit 15 and obtains coordinates of the inspection mark of the mark seed data 140 arranged on the scribe line, i.e., the first point and the second point, from the scribe line data with reference to the coordinate system of the mask (Step S141).

For example, in FIG. 6 illustrating the mask data 100A of a layer AA, the center of the mask is the origin of the coordinate system of the mask. In the mask data 100A, four pieces of the mark seed data 140-1 to 140-4 are arranged. The positions of the first point F1 and the second point S1 of the mark seed data 140-1 in the coordinate system of the mask are (x1, y1) and (x1+s, y1+t), respectively. The positions of the first point F2 and the second point S2 of the mark seed data 140-2 are (x2, y2) and (x2+s, y2+t), respectively. The positions of the first point F3 and the second point S3 of the mark seed data 140-3 are (x3, y3) and (x3+t, y3−s), respectively. The positions of the first point F4 and the second point S4 of the mark seed data 140-4 are (x4, y4) and (x4+t, y4−s), respectively.

Moreover, at this time, the arrangement area of the mark seed data corresponding to the inspection mark is specified from the position of the first point of the inspection mark. For example, in the case of FIG. 9, the range of the scribe lines (or XU and XD) parallel to the X axis with reference to the coordinate system of the mask and the range of the scribe lines (or YR and YL) parallel to the Y axis with reference to the coordinate system of the mask are preset, and the arrangement area is specified in accordance with which range the first point (or the second point in addition thereto) is present. Furthermore, the arrangement check rule corresponding to the obtained block name is determined from the inspection-mark arrangement check rule of the inspection-mark-arrangement-check-rule storing unit 17.

FIGS. 13A and 13B are diagrams illustrating an example of the arrangement check information. In the above process, as shown in FIG. 13A, information corresponding to the items of the "block name", the "attribute value", the "first point coordinates", the "arrangement area", and the "mark type" in the arrangement check information is obtained and stored. The "block name" and the "attribute value" can be obtained from the read scribe line data, the "first point coordinates" and the "arrangement area" are values obtained by the arrangement information detecting unit 16, and the "mark type" that corresponds to the obtained block name is obtained from the arrangement-check-rule correspondence table shown in FIG. 8C. In FIG. 13A and FIG. 13B, only the mark seed data (block name) of which attribute value (layer name) "AA" is input; however, practically, all of the mark seed data included in the mask data of each layer (process) generated for one product is extracted and is input to the above arrangement check information.

Next, the arrangement information detecting unit 16 obtains the relative position information from the obtained coordinates for the inspection mark of each mark seed data (Step S142). In an example shown in FIG. 6, the positions of the second points S1 to S4 with reference to the first points F1 to F4 are obtained for the inspection marks of the mark seed data 140-1 to 140-4. At this time, the attribute information in which "@p" is added to the attribute information on the first points F1 to F4 is set to the second points S1 to S4, so that it is possible to distinguish between the second points S1 to S4 and the first points F1 to F4 based on the presence or absence of "@p".

In the case of the mark seed data 140-1, the relative position information on the coordinates (x1+s, y1+t) of the second point S1 of which attribute information is "AA@p" with respect to the coordinates (x1, y1) of the first point F1 of which attribute information is "AA" is calculated. Consequently, (s, t) is obtained as the relative position information (vector information). In the similar manner, (s, t), (t, −s), and (t, −s) are obtained for the mark seed data 140-2 to 140-4 as the relative position information, respectively.

Thereafter, the arrangement information detecting unit 16 refers to the correspondence information between the relative position and the arrangement state shown in FIG. 7 and obtains the arrangement information including the rotation angle from the arrangement direction as a reference of the mark seed data and the presence or absence of the mirroring for each inspection mark from the calculated relative position information (Step S143).

FIG. 14 is a diagram schematically illustrating a calculation process of the arrangement information. Each of the mark seed data 140-1 to 140-4 arranged in the mask data 100A shown in FIG. 6 is compared with the correspondence information between the relative position and the arrangement state shown in FIG. 7 to visually illustrate a method for obtaining the arrangement information. In an example illustrated in FIG. 6, the relative position information on the inspection marks of the mark seed data 140-1 and 140-2 is (s, t), so that the arrangement information is such that the rotation angle is 0° with no mirroring from FIG. 7. Moreover, the relative position information on the inspection marks of the mark seed data 140-3 and 140-4 is (t, −s), so that the arrangement information is such that the rotation angle is 270° counterclockwise (left-handed) with no mirroring from FIG. 7. Then, the result is stored in the arrangement check information as shown in FIG. 13B. Specifically, "0°" is input to the rotation angle and "no" is input to the presence or absence of the mirroring in the records of which "first point coordinates" is (x1, y1) and (x2, y2), and "270°" is input to the rotation angle and "no" is input to the presence or absence of the mirroring in the records of which "first point coordinates" is (x3, y3) and (x4, y4).

In the above manner, the arrangement information about the mark seed data 140 included in the scribe line data is obtained. Then, the process is returned to the flowchart shown in FIG. 11.

After obtaining the arrangement information for each mark seed data, the inspection-mark-arrangement checking unit 18 performs a process of judging whether the mark seed data corresponding to the record stored in the arrangement check information is arranged in accordance with the arrangement check rule (Step S15).

Specifically, the inspection-mark arrangement check rule shown in FIG. 8A and FIG. 8B specified with the mark type "MK_TYPE_1" in the record stored in the arrangement check information as shown in FIG. 13B, for example, in the record in which the block name is "BLK_AA", the attribute value is "AA", and the first point coordinates are "(x1, y1)" is obtained from the inspection-mark-arrangement-check-rule storing unit 17. Then, the arrangement check rule corresponding to the arrangement area of the arrangement check information is obtained from the rotation angle rule and the mirroring rule. In this example, the rotation angle "0°" and the presence or absence of the mirroring "no" in the case when the mark type is "MK_TYPE_1" and the mark seed data is arranged on the X axis are obtained. Then, the obtained content is compared with the rotation angle "0°" and the presence or absence of the mirroring "no" input in FIG. 13B. Because both match each other as a result of the comparison, it is judged that the mark seed data corresponding to the record is correctly arranged, and as shown in FIG. 10, information ("OK" in this case) indicating the correct arrangement is stored in the item "judgment result" of the arrangement check information. It is judged whether the mark seed data is correctly arranged for the records that are specified from other block names, attribute values, and first point coordinates in the similar manner, and the judgment result thereof is input as shown in FIG. 10. When the arrangement information does not match the arrangement check rule, information (for example, "error") indicating the incorrect arrangement is input to the item "judgment result" of the check information.

Thereafter, the result display processing unit 19 displays the arrangement check information in which the judgment result is input on the display unit 20 (Step S16), and the process ends. At this time, an incorrectly arranged record can be highlighted or only the incorrectly arranged record can be displayed on the display unit.

In the above explanation, an example is given for a case where the inspection mark has two points; however, it is not limited thereto, and the inspection mark, for example, having a polygon shape formed by three or more points or an arrow shape can be generated as long as the inspection mark can obtain vector information capable of detecting the direction and the presence or absence of the mirroring of the mark seed data.

Moreover, it is possible that the mark arrangement inspecting method for performing a judgment process of judging whether the arrangement state of the mark seed data on the mask data, in which the mark seed data that includes the inspection mark described in the present embodiment is arranged and which is used in each layer follows the arrangement check rule is implemented as a computer program to be executed by a computer. The computer program for causing a computer to execute the mark arrangement inspecting method is provided in such a way that the computer program is recorded as an installable format file or executable format file in a computer-readable recording medium such as a compact disc read only memory (CD-ROM), a floppy (registered trademark) disk, and a digital versatile disc or a digital video disc (DVD). The computer program for causing a computer to execute the mark arrangement inspecting method explained in the present embodiment can be stored in a computer connected to the network such as the Internet, and downloaded via the network.

When the mark arrangement inspecting method is implemented as a computer program to be executed by a computer, the above described mark arrangement inspecting apparatus can be configured by an information processing apparatus such as a personal computer that includes a calculating unit such as a central processing unit (CPU), a storing unit such as a read only memory (ROM) and a random access memory (RAM), an external storing unit such a hard disk drive (HDD) and a CD-ROM drive device, a display unit such a display device, an input unit such as a keyboard and a mouse, and a network interface such as a network board if necessary. In this case, a computer program that causes a computer to execute the mark arrangement inspecting method installed in the external storing unit is loaded on the storing unit such as a RAM and is executed by the calculating unit, thereby performing the above method.

Figure 15A:
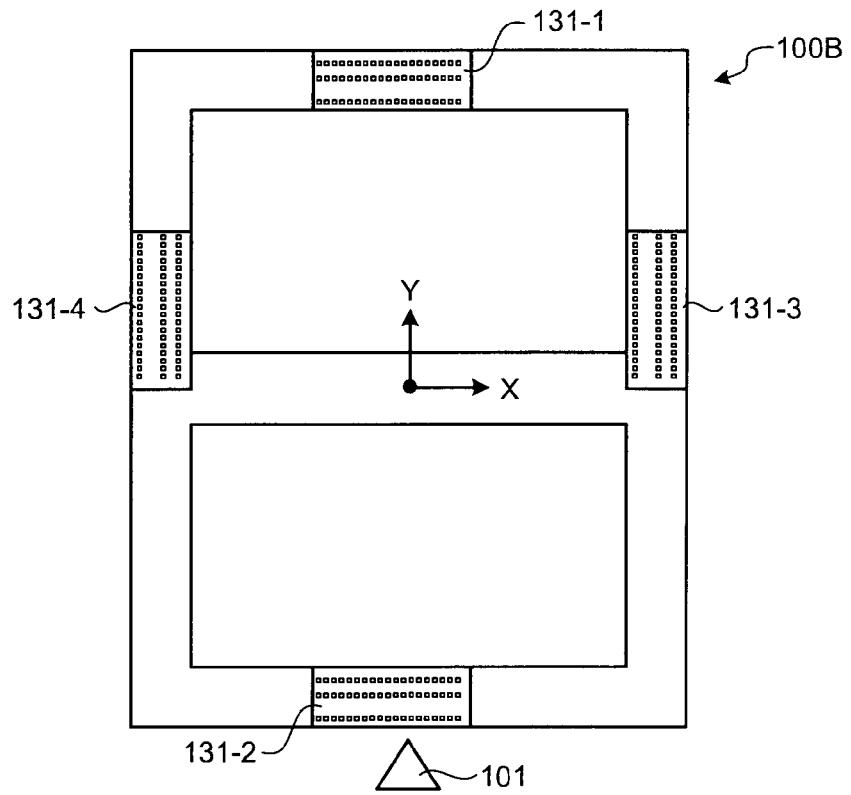
FIGS. 15A and 15B are diagrams illustrating an example of the mask data.
Figure 15B:
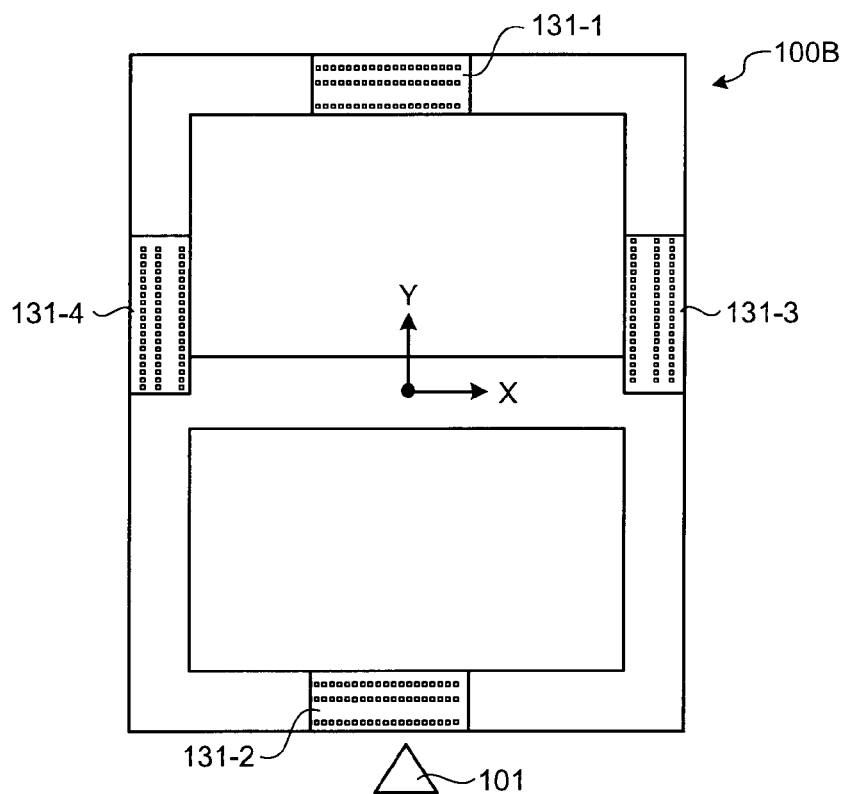

Finally, the effect of the first embodiment is explained while comparing with the conventional example. FIGS. 15A and 15B are diagrams illustrating an example of the mask data, in which FIG. 15A is a diagram when the mark data are correctly arranged in accordance with the arrangement check rule and FIG. 15B is a diagram when some mark data are arranged not in accordance with the arrangement check rule. The mark data 131 shown in FIG. 2A is arranged on the scribe line shown in FIG. 15A and FIG. 15B. In the mark data 131, as shown in FIG. 2A, the interval between the light transmitting portion rows 1312A and 1312B is 10 µm, whereas the interval between the light transmitting portion rows 1312B and 1312C is 20 µm.

Conventionally, mask data 100B shown in FIG. 15A and FIG. 15B is displayed on the display unit and a user visually checks whether the arrangement of the mark data including mark data 131-1 to 131-4 is correct. However, as shown in FIG. 2A, if the difference between the interval between the light transmitting portion rows 1312A and 1312B and the interval between the light transmitting portion rows 1312B and 1312C is minute, it is difficult to check and an error occurs easily in the judgment of whether the mark data is correctly arranged in accordance with the arrangement check rule in the visual inspection. For example, the mark data 131-4 is arranged incorrectly in FIG. 15B compared with the case shown in FIG. 15A, and such error is easily missed. Moreover, as described above, the number of marks used in one product is about 1500, so that the possibility to miss the arrangement error is high if the arrangement of the mark data is checked visually.

On the contrary, according to the first embodiment, the mark seed data in which the inspection mark that is arranged only on design data and is not drawn on a mask is set to the mark data arranged on a scribe line is prepared, and the judgment of whether the mark seed data is arranged in accordance with the arrangement rule on the scribe line of each layer is performed on an apparatus such as an information processing apparatus by using the inspection mark, after generating the scribe line data by using the mark seed data. Consequently, it is possible to suppress that incorrect arrangement of the mark seed data is missed and shorten the processing time consumed in the inspection compared with the conventional visual inspection. As a result, the mask data can be corrected before manufacturing a mask and it is possible to prevent manufacturing of the mask with which exposure and inspection cannot be performed, so that the TAT and the manufacturing cost for a semiconductor device or the like do not increase.

(Second Embodiment)

In the first embodiment, the rotation angle to be allowed and the presence or absence of the mirroring are set for each axis direction (on the X/Y axis) or each position (for example, XD, XU, YR, and YL shown in FIG. 9) of a scribe line to perform checking. In the second embodiment, explanation is given for the case of checking the mark data having a dependency to a direction of a word line (WL) formed (designed) in a chip body.

Figure 16A:
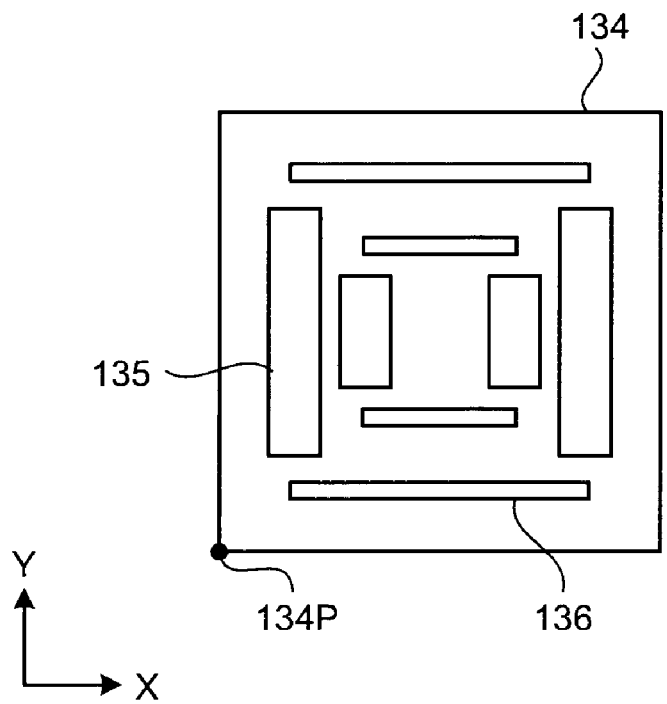
FIGS. 16A and 16B are diagrams schematically illustrating a state where the mark seed data is exposed by using an X/Y asymmetric illumination.
Figure 16B:
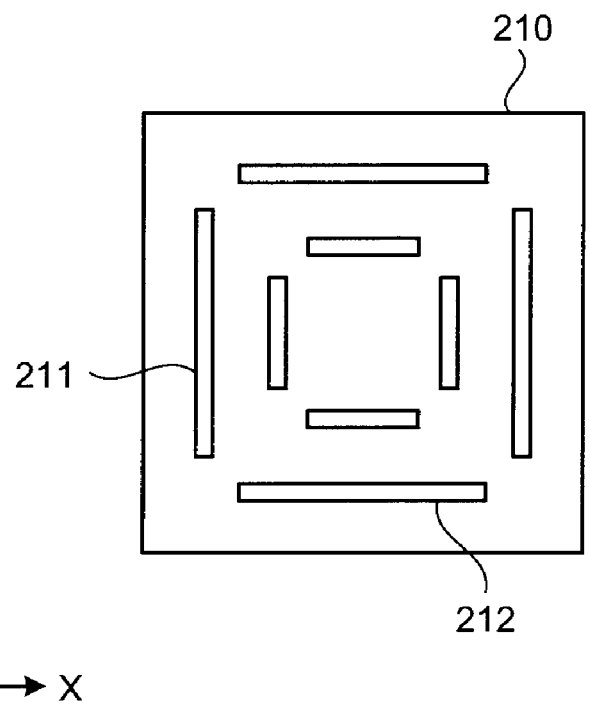

In a memory product, when coordinates of a mask reference are arranged, an X/Y asymmetric illumination is used in some cases to improve the resolution in the lithography. FIGS. 16A and 16B are diagrams schematically illustrating a state where the mark seed data is exposed by using the X/Y asymmetric illumination, in which FIG. 16A is a diagram illustrating an example of the mark data and FIG. 16B is a diagram illustrating an example of a mark pattern that is exposed and developed by the mark data. In FIGS. 16A and 16B, the X axis is taken in a right and left direction on the drawing sheet and the Y axis is taken in a direction vertical to the X axis. When the X/Y asymmetric illumination is used as an illumination to be used for exposure, the resolution becomes different in the X-axis direction and the Y-axis direction, so that the size of design data (mask data) needs to be corrected in some cases for causing the shape of a mark formed on a process target to be the same in the X/Y-axis directions.

For example, in the case where a mark pattern 210 shown in FIG. 16B is formed on a process target by using the X/Y asymmetric illumination of which resolution is different in the X/Y-axis directions as described above, when the size of mark data 134 of the mask data is caused to be the same as that of the mark pattern 210 on the process target, patterns 135 and 136 are formed as the mark data 134 shown in FIG. 16A. The patterns 135 and 136 are equal in size in the Y-axis direction to patterns 211 and 212 of the mark pattern 210 and are longer (thicker) in size in the x-axis direction than the patterns 211 and 212 of the mark pattern 210. In this case, the direction in which the pattern is thickened coincides with the direction of the word line. Moreover, the patterns 135 and 136 for two layers are arranged in the mark data 134 for convenience' sake of explanation.

In the mask data in which the mark data 134 formed in such a manner is arranged, the directional dependency occurs to the design data (mask data) of the mark data 134 with respect to the word line, which is a limitation independent from the directional dependency with respect to the notch direction in the first embodiment.

In the second embodiment, explanation is given for the mark arrangement inspecting method for inspecting whether the direction with respect to the word line follows an arrangement check rule for the word line for the mark data arranged on the mask data, and a mark.

FIG. 17 is a diagram illustrating an example of the inspection mark according to the second embodiment. An example is given for the case where two points 151A and 151B are arranged as the inspection mark on mark data 137 to form mark seed data 150. A right and left direction on the drawing sheet is an extending direction of the word line, and the right and left direction in FIG. 17 is the X axis and a direction vertical to the X-axis direction in the drawing sheet is the Y axis with a corner 137P of the lower left of the mark data 137 as the origin. As shown in FIG. 17, in the similar manner to the explanation in the first embodiment, the first point 151A is a mark reference point and is often the center (center of gravity) of the mark seed data 150. The first point 151A also includes attribute information 152A such as a character string. In this case, the layer name (process name) in which the first point 151A is arranged is set as the attribute information 152A. Consequently, the position of the first point 151A is (a, b) and the "layer name" is set as the attribute information 152A.

The second point 151B is a point that is arranged at a position shifted by a predetermined distance from the first point 151A in the X axis direction and the Y axis direction. For example, the second point 151B is arranged at a position that is shifted by a distance u in the X axis direction and by a distance v in the Y axis direction with respect to the first point 151A. The values u and v are fixed values and do not become zero simultaneously. The second point 151B also includes attribute information 152B which is obtained by adding information for identification of the second point 151B arranged with reference to the direction of the word line to the attribute value of the first point 151A. In this case, the attribute information 152B of the second point 151B is expressed as "(first point attribute value)+@wl". Therefore, the position of the second point 151B is (a+u, b+v) and the attribute information 152B is "layer name @wl".

In the following drawings, for easily visually distinguishing between the first point 151A and the second point 151B, an arrow 153 that is directed from the first point 151A to the second point 151B is drawn together. For the mark data that is not needed to judge the presence or absence of the rotation, the second point 151B does not need to be arranged as the inspection mark. However, as described above, the first point 151A is needed for a recipe of an exposing apparatus or an alignment inspection apparatus, so that the first point 151A is necessarily arranged. Moreover, the inspection mark is data that is present on design data (CAD data) but is not drawn on a mask in the similar manner to the first embodiment.

Figure 18A:
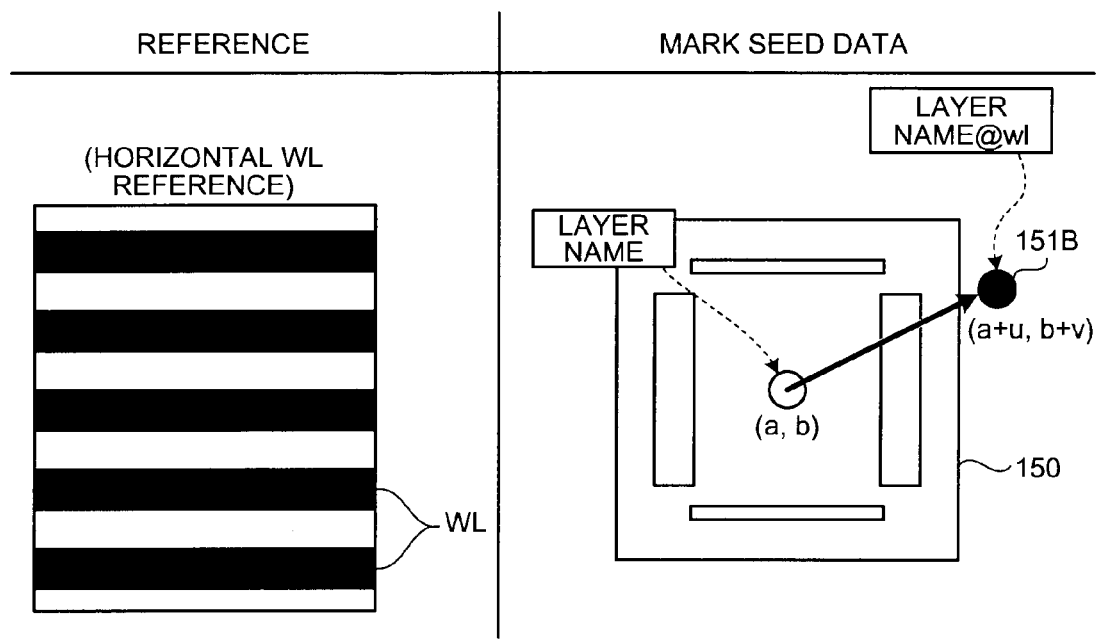
FIGS. 18A and 18B are diagrams illustrating an example of a relationship between a word line and a direction of the inspection mark.
Figure 18B:
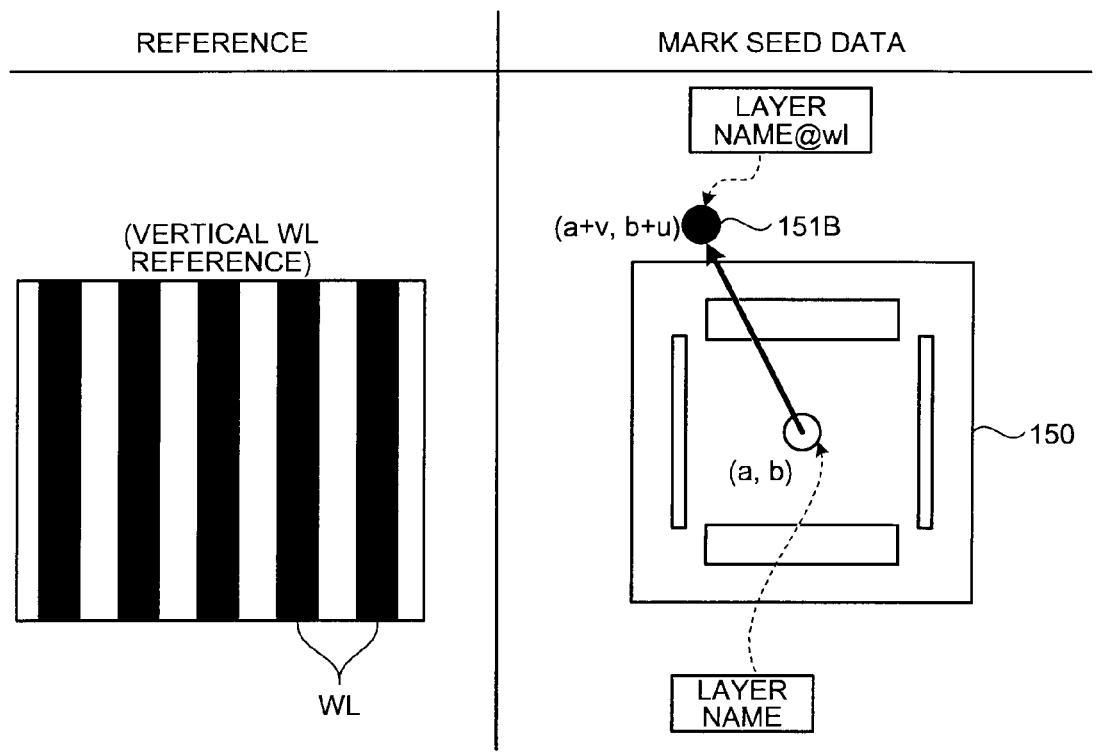

FIGS. 18A and 18B are diagrams illustrating an example of a relationship between the word line and the direction of the inspection mark. As shown in FIG. 18A, it is defined such that the second point 151B is arranged to direct the vector toward the upper right on the mark data that is drawn with reference to the case where a word line WL is formed in the right and left direction (hereinafter, horizontal direction) on the drawing sheet. The mark seed data 150 formed in such a manner can be used at the rotation angles of 0° and 180° in the case of the work line (hereinafter, horizontal word line) formed in a horizontal direction, and can be used at the rotation angles of 90° and 270° in the case of the work line (hereinafter, vertical word line) formed in a vertical direction that is vertical to the horizontal direction.

Moreover, as shown in FIG. 18B, on the mark data generated with reference to the case where the word line WL is formed in the up and down direction (vertical direction) on the drawing sheet, it is possible to define so that the second point 151B is arranged to direct the vector toward the upper left. The mark seed data 150 formed in such a manner can be used at the rotation angles of 0° and 180° in the case of the vertical word line, and can be used at the rotation angles of 90° and 270° in the case of the horizontal word line. In generating the mark seed data, any one of FIG. 18A and FIG. 18B can be used as a reference. In this manner, the inspection mark in this example expresses a direction in which the arrangement of the word line WL is allowed.

Figure 19:
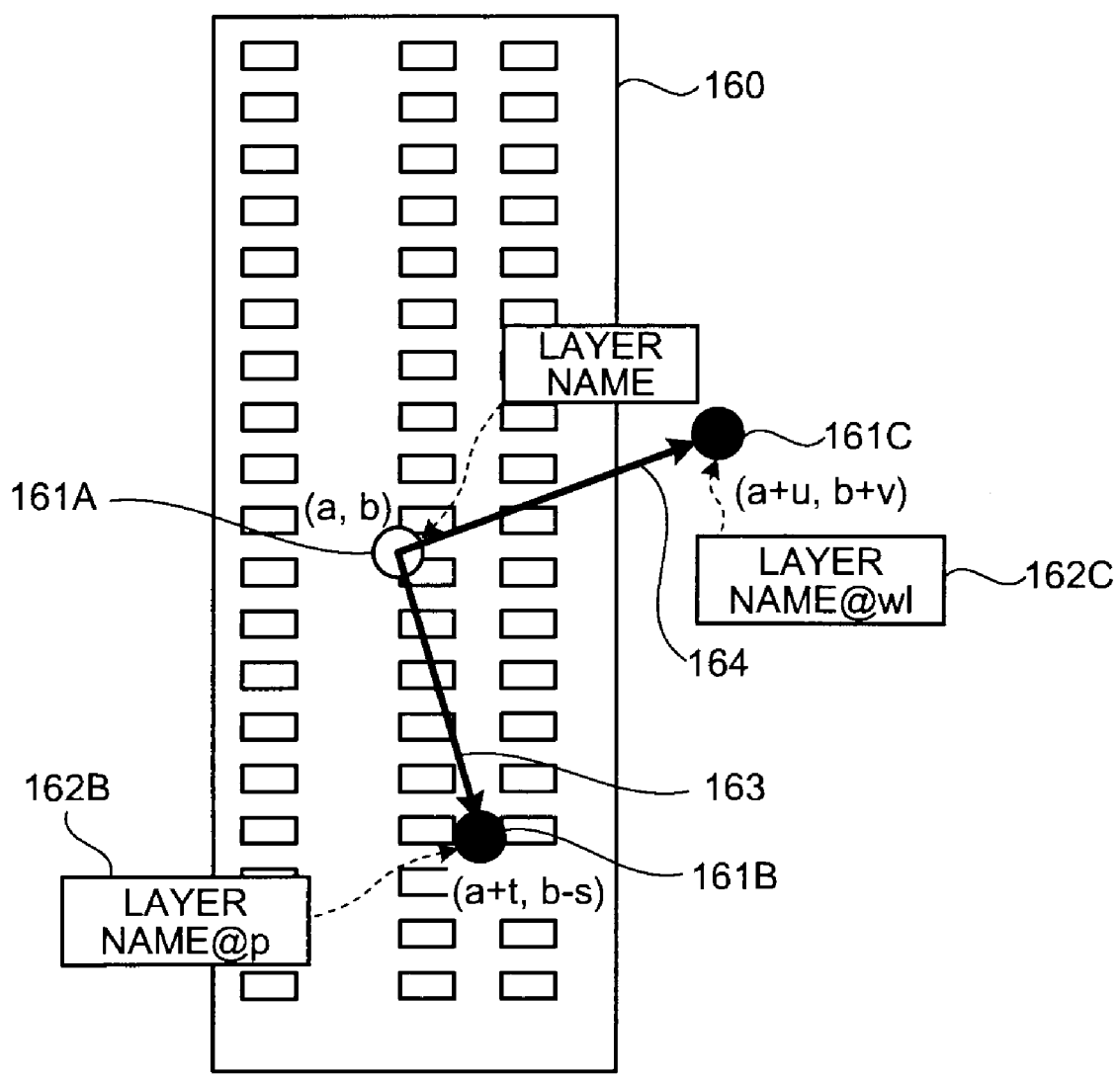
FIG. 19 is a diagram illustrating an example of the inspection mark.

In the above explanation, explanation is given for the case of setting the inspection mark indicating the direction of the word line to the mark seed data; however, it is possible to provide a first inspection mark with which the arrangement direction with respect to the Cartesian coordinate system with reference to the notch explained in the first embodiment is detected and a second inspection mark that indicates the direction of the word line in one piece of the mark seed data. FIG. 19 is a diagram illustrating an example of the inspection mark. In FIG. 19, in mark seed data 160, a first inspection mark 163 that indicates the arrangement direction of the mark seed data 160 with respect to the Cartesian coordinate system with reference to the notch and a second inspection mark 164 that indicates the arrangement direction of the mark seed data 160 with respect to the word line are provided. The first inspection mark 163 and the second inspection mark 164 can be distinguished by attribute information 162B and 162C.

The configuration of the mark arrangement inspecting apparatus that performs the arrangement inspection on the mark data by using such mark seed data is almost the same as that explained in the first embodiment with reference to FIG. 3, and only parts different from the first embodiment are simply explained.

The mark-seed-data designing unit 12 adds the block name with which the mark seed data can be uniquely identified to the mark seed data to which the inspection mark is set in accordance with the above rule with respect to the designed mark data to store it in the mark-seed-data storing unit 13. The mark-seed-data storing unit 13 stores therein the mark seed data in which a pattern is formed with respect to the direction of the word line.

The arrangement information detecting unit 16 obtains the coordinates of the inspection mark by using the Cartesian coordinate system provided with reference to the notch for the mark seed data arranged on a scribe line of the mask data, and further calculates the relative position information as the vector information from the obtained coordinates and obtains the arrangement information that includes the rotation angle of the mark data in the Cartesian coordinate system with reference to the notch and the direction of the word line that is allowed in the mark seed data. The presence or absence of the mirroring is irrelevant to the judgment of the horizontal and vertical, so that it is ignored.

Figure 20:
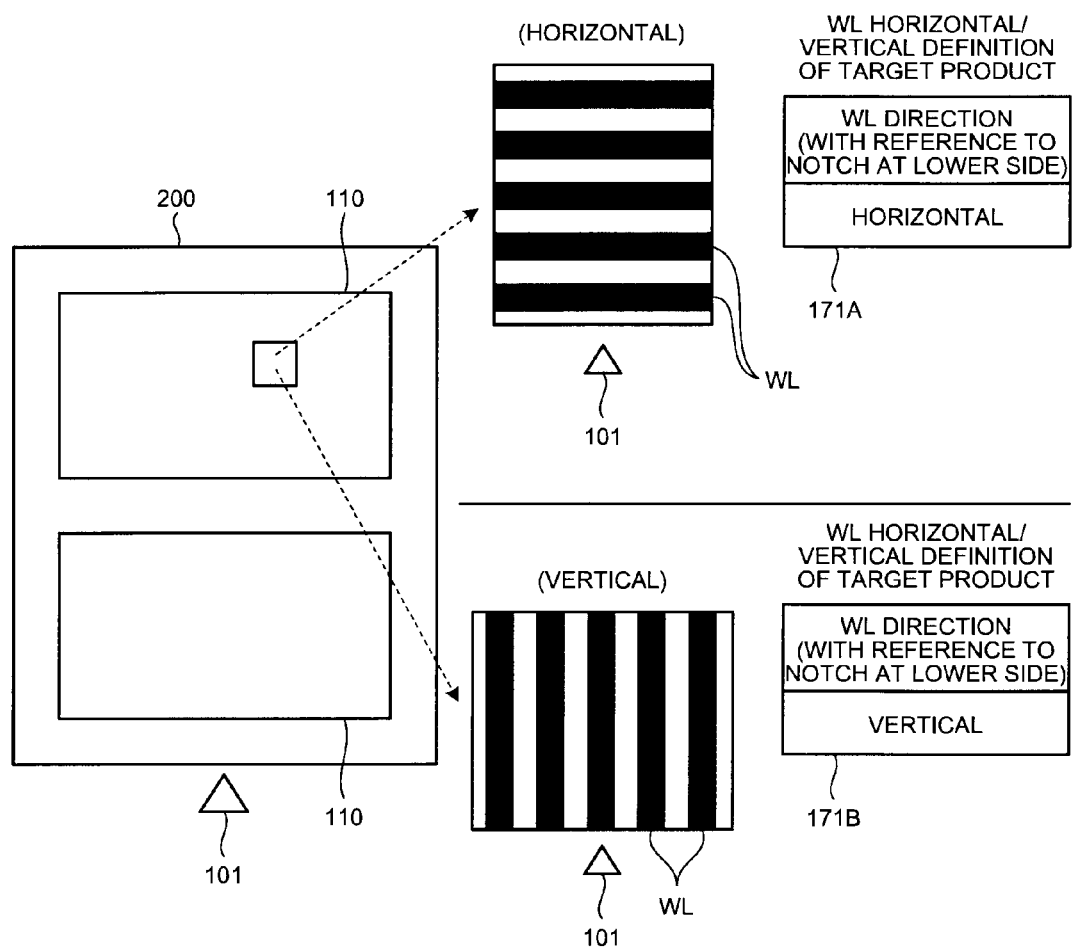
FIG. 20 is a diagram schematically illustrating an example of a word line horizontal/vertical definition of a target product.

The inspection-mark-arrangement-check-rule storing unit 17 stores therein a word line horizontal/vertical definition of a target product. FIG. 20 is a diagram schematically illustrating an example of the word line horizontal/vertical definition of a target product. For example, when the word line WL formed on the chip data 110 in one shot area 200 is formed in a horizontal direction with reference to the case where the notch 101 is arranged on the lower side of the shot area 200, a word line horizontal/vertical definition 171A of a target product is defined as "horizontal". When the word line WL formed on the chip data 110 in the shot area 200 is formed in a vertical direction with reference to the case where the notch 101 is arranged on the lower side of the shot area 200, a word line horizontal/vertical definition 171B of a target product is defined as "vertical". Because the word line direction is defined in one direction for one product, the above word line horizontal/vertical definition is used commonly for one product. In other words, the same word line horizontal/vertical definition is set for all of the mark seed data used for one product. Moreover, in the similar manner to the first embodiment, when the arrangement state of the mark seed data in the Cartesian coordinate system set with respect to the notch is also checked, the arrangement check rule is managed for every product.

Next, the process procedure of the mark arrangement inspecting method according to the second embodiment is specifically explained with reference to the flowcharts shown in FIG. 11 and FIG. 12 in the first embodiment.

At Step S11, when a user inputs information including predetermined shape and pattern from the input unit 11 and the mark data to be used in each layer (process) is designed, the mark-seed-data designing unit 12 arranges the inspection mark in the mark data to generate the mark seed data at Step S12. In the present embodiment, as shown in FIG. 17, the inspection mark including the first point 151A and the second point 151B is set and the attribute information 152A and 152B are also set to the first point 151A and the second point 151B, respectively. The attribute information 152A of the first point 151A is "AA" and the attribute information 152B of the second point 151B is ""AA@wl. The generated mark seed data 150 is stored in the mark-seed-data storing unit 13.

Figure 21:
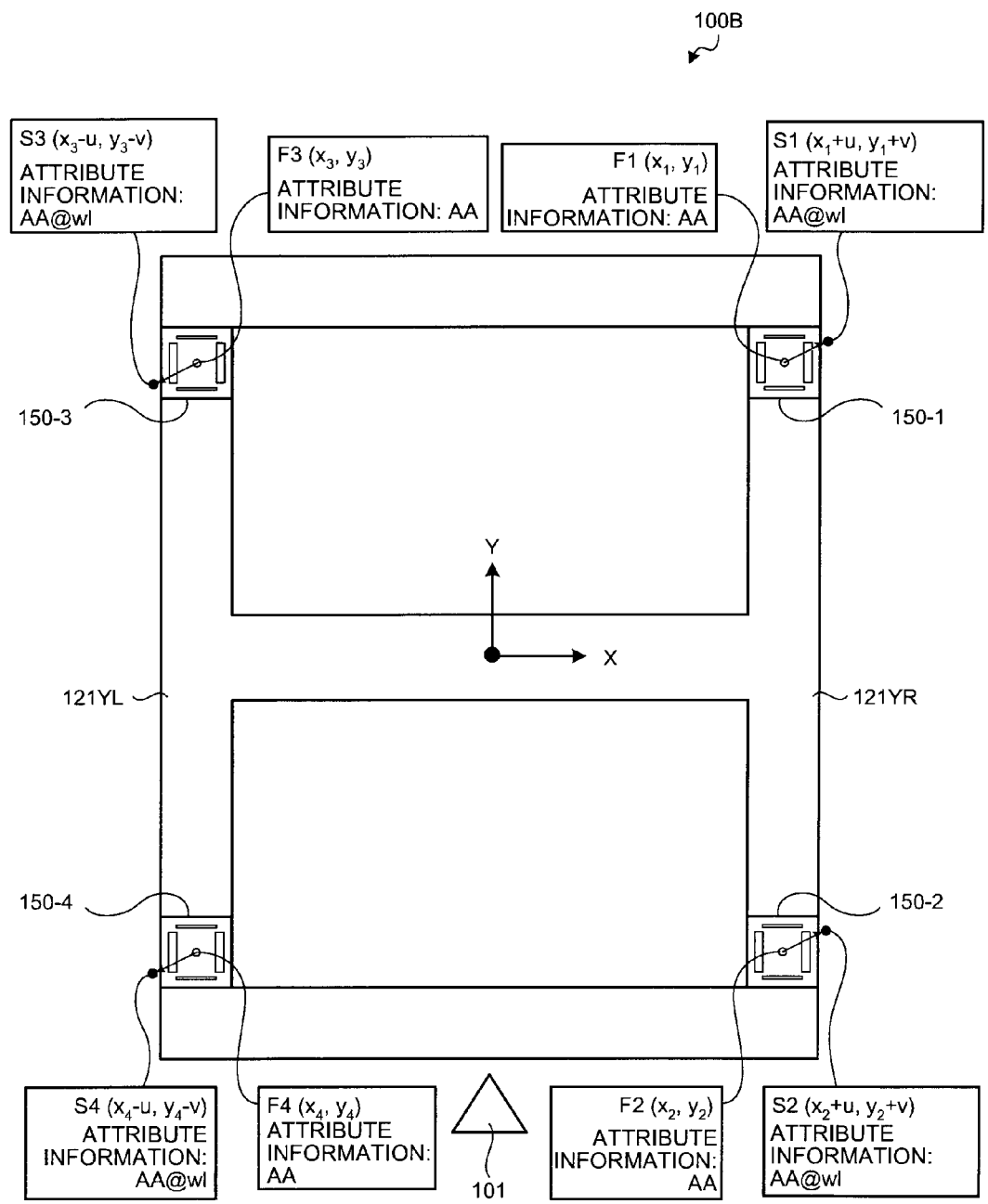
FIG. 21 is a diagram illustrating an example of a state where mark seed data are arranged on scribe lines.

At Step S13, the mark seed data stored in the mark-seed-data storing unit 13 is arranged on a scribe line of each layer by a user via the input unit 11 or by the mark arranging unit 14 in accordance with the preset mark-seed-data arrangement rule, whereby the scribe line data is generated. FIG. 21 is a diagram illustrating an example of a state where the mark seed data are arranged on the scribe lines. In FIG. 21, the Cartesian coordinate system in which a right and left direction is the X axis and an up and down direction is the Y axis when the notch 101 is arranged on the lower side is arranged in the mask data 100B so that the center (center of gravity) of the mask data 100B is the origin. On a scribe line 121YR, mark seed data 150-1 and 150-2 in the state of FIG. 17 are arranged, and on a scribe line 121YL, mark seed data 150-3 and 150-4 that are rotated by 180° counterclockwise from the state of FIG. 17 are arranged.

At Step S14, the arrangement information detecting unit 16 reads the scribe line data on the mask data of a layer from the scribe-line-data storing unit 15 and obtains the arrangement information by using the first point and the second point of the mark seed data arranged on a scribe line from the scribe line data. Specifically, the arrangement information is obtained by the following Steps S141 to S143.

At Step S141, in the example of FIG. 21 illustrating the mask data 100B of a layer AA, the center of the mask is the origin of the coordinate system of the mask. In the mask data 100B, four pieces of the mark seed data 150-1 to 150-4 are arranged. The positions of the first point F1 and the second point S1 of the mark seed data 150-1 in the coordinate system of the mask are (x1, y1) and (x1+u, y1+v), respectively. The positions of the first point F2 and the second point S2 of the mark seed data 150-2 are (x2, y2) and (x2+u, y2+v), respectively. The positions of the first point F3 and the second point S3 of the mark seed data 150-3 are (x3, y3) and (x3−u, y3−v), respectively. The positions of the first point F4 and the second point S4 of the mark seed data 150-4 are (x4, y4) and (x4−u, y4−v), respectively.

The arrangement information detecting unit 16 inputs the obtained information to the arrangement check information. FIGS. 22A to 22C are diagrams illustrating an example the arrangement check information. In the above process, as shown in FIG. 22A, items corresponding to the "block name", the "attribute value", the "first point coordinates", and a "work line direction of a product" in the arrangement check information are input. The "block name" and the "attribute value" can be obtained from the read scribe line data, and the "first point coordinates" is a coordinate value at the first point obtained by the arrangement information detecting unit 16. The "work line direction of a product" is the word line horizontal/vertical definition of a target product stored in the inspection-mark-arrangement-check-rule storing unit 17. As described above, one definition corresponds to one product and the mark seed data for one product are collectively inspected, so that the same value is input for all of the records of the product under the inspection. In this case, the "word line horizontal/vertical definition" is the horizontal direction. In FIGS. 22A to 22C, only the mark seed data (block name) of which attribute value (layer name) is "AA" is input; however, practically, all of the mark seed data included in the mask data of each layer (process) generated for one product is extracted and is input to the above arrangement check information.

At the Step S142, the arrangement information detecting unit 16 obtains the relative position information from the coordinates obtained for the inspection mark of each mark seed data. In an example shown in FIG. 21, the second points S1 to S4 with reference to the first points F1 to F4 are obtained for the inspection marks of the mark seed data 150-1 to 150-4. At this time, the attribute information in which "@wl" is added to the attribute information on the first points F1 to F4 is set to the second points S1 to S4, so that it is possible to distinguish between the second points S1 to S4 and the first points F1 to F4 based on the presence or absence of "@wl".

In the case of the mark seed data 150-1, the relative position information on the coordinates (x1+u, y1+v) of the second point S1 of which attribute information is "AA@wl" with respect to the coordinates (x1, y1) of the first point F1 of which attribute information is "AA" is calculated. Consequently, (u, v) is obtained as the relative position information. In the similar manner, (u, v), (−u, −v), and (−u, −v) are obtained for the mark seed data 150-2 to 150-4 as the relative position information, respectively.

At Step S143, the arrangement information detecting unit 16 calculates the rotation angle of the arranged mark seed data with reference to the coordinate system of the mask from the calculated relative position information, and further obtains the direction (hereinafter, mark allowing word line direction) of the word line allowed in the mark seed data by using the correspondence information between the rotation angle and the word line direction. FIG. 23 is a diagram illustrating an example of the correspondence information between the rotation angle and the word line direction. As shown in FIG. 23, the relative position information on the inspection mark arranged in the mask coordinate system can correspond to the rotation angle in the mask coordinate system, and furthermore the rotation angle thereof can correspond to the mark allowing word line direction.

In an example shown in FIG. 21, the relative position information on the inspection marks of the mark seed data 150-1 and 150-2 is (u, v), so that the rotation angle in the mask coordinate system is 0° from FIG. 23. Moreover, when the rotation angle is 0°, the mark allowing word line direction is horizontal. In this manner, the arrangement information including the rotation angle and the mark allowing word line direction is obtained. In the similar manner, the relative position information on the inspection marks of the mark seed data 150-3 and 150-4 is (−u, −v), so that the rotation angle in the mask coordinate system is 180° and the mark allowing word line direction is horizontal. This result is stored in the arrangement check information in FIG. 22B. Specifically, "0°" is input to the "rotation angle with reference to the mask coordinate system" and "horizontal" is input to the "mark allowing word line direction" in the records of which first point coordinates are (x1, y1) and (x2, y2), and "180°" is input to the "rotation angle with reference to the mask coordinate system" and "horizontal" is input to the "mark allowing word line direction" in the records of which first point coordinates are (x3, y3) and (x4, y4).

At Step S15, the inspection-mark-arrangement checking unit 18 performs a process of judging whether the mark allowing word line direction matches the value in the word line direction of a product for the record stored in the arrangement check information. Specifically, the value "horizontal" of the "mark allowing word line direction" is compared with the value "horizontal" of the "work line direction of a product" in the record stored in the arrangement check information shown in FIG. 22B, for example, in the record in which the block name is "BLK_AA", the attribute value is "AA", and the coordinates are "(x1, y1)", and judges whether both match each other. Because both match each other as a result of the comparison, information ("OK" in this case) indicating the correct arrangement is stored in the item "judgment result" of the arrangement check information. It is judged whether the mark seed data is correctly arranged for the records that are specified from other block names, attribute values, and coordinates in the similar manner, and the judgment result thereof is input as shown in FIG. 22C. When both do not match each other, information (for example, "error") indicating the incorrect arrangement is stored in the item "judgment result".

At Step S16, the result display processing unit 19 displays the arrangement check information in which the judgment result is input on the display unit 20. At this time, an incorrectly arranged record can be highlighted or only the incorrectly arranged record can be displayed on the display unit. Then, the process of the mark arrangement inspecting method ends.

When the judgment result is error, a user corrects the rotation direction of corresponding mark seed data. If the limitation of a mark with respect to the notch direction in the first embodiment cannot be satisfied due to the rotation, new mark seed data needs to be generated.

In the same process (manufacturing process is equivalent), the same mark on a scribe line can be basically utilized and the same arrangement check rule and the like are also used. However, even in the same process, when the direction of the word line is different between products, the rule other than that can be used without change by correcting the relationship between the notch direction and the word line direction in the word line horizontal/vertical definition of a target product shown in FIG. 20.

Moreover, in the above explanation, explanation is given for the case of checking the mark data having a dependency to the direction of the word line (WL) formed (designed) in a chip body; however, it is possible to apply the present embodiment to the check of the mark data having a dependency to the direction of a predetermined pattern in a chip, an arrangement permission to the direction of the asymmetric illumination, and the like, in addition to the word line.

In the similar manner to the first embodiment, it is possible that the mark arrangement inspecting method in the second embodiment is performed by a computer program to be executed by a computer.

According to the second embodiment, when the resolution of the illumination to be used at the exposure is different in two directions that are orthogonal to each other and the extending direction of the word line needs to match any one of the directions of the resolution, the mark seed data in which the inspection mark indicating the arrangement allowing direction of the word line is set as design data that is not transferred onto a mask is arranged on a scribe line, and it is judged whether the extending direction of the word line defined in a product matches the arrangement allowing direction of the word line of the mark seed data on an apparatus such as an information processing apparatus by using the inspection mark of the mark seed data arranged on the scribe line data. Consequently, it is possible to easily detect incorrect arrangement of the arrangement direction of the mart type data to be arranged with respect to the word line.

Moreover, a semiconductor device can be manufactured by exposing a resist that is applied on a process target such as a semiconductor substrate or various films formed on the semiconductor substrate by using a mask on which a pattern of a chip body and a pattern of a mark on a scribe line are formed on a transparent substrate by a light shielding film and by processing the process target by using the pattern obtained by developing the resist, based on the mask data in which the mark seed data is correctly arranged by the above method.

In the above explanation, an example is given for the case of inspecting an alignment mark or a measurement mark in design data of a mask to be used in manufacturing a semiconductor device. However, the above explanation can be applied to the case of inspecting an alignment mark or a measurement mark in design data of a mask to be used in an apparatus (for example, a liquid crystal display apparatus) that is manufactured by providing the alignment mark for positioning for ensuring a relative position between respective processes, the measurement mark for inspecting displacement or a process result, and the like on a scribe line.

As described above, according to the present embodiments of the present invention, it is possible to provide a mark arrangement inspecting method capable of reducing an arrangement error of mark data arranged on a scribe line such as an alignment mark or a measurement mark at the designing of scribe line data, and a mark.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of inspecting a mark arrangement for inspecting an arrangement state of mark data corresponding to a mark in mask data for manufacturing a mask including the mark for alignment or measurement formed on a scribe line of a process target, the method comprising:
    generating, by a processor, mark seed data that includes an inspection mark that includes vector information for detecting a rotation in units of a predetermined angle or a mirroring of the mark and that is not drawn on the mask, and the mark data;
    generating, by a processor, the mask data in which the mark seed data is arranged on the scribe line of the mask;
    calculating, by a processor, coordinates of the inspection mark from a reference position set to the mask data for each of the mark seed data in the mask data;
    detecting, by a processor, an arrangement state of the inspection mark with respect to the reference position by using calculated coordinates and the vector information on the inspection mark; and
    judging, by a processor, whether the mark seed data is correctly arranged on the scribe line by comparing the arrangement state of the inspection mark with an arrangement check rule that defines an arrangement state of the mark seed data on the mask,
    wherein the inspection mark is a first inspection mark that includes a first point in the mark seed data and a second point that is shifted by a distance s with fixed value in a first direction and by a distance t with fixed value in a second direction that is vertical to the first direction from the first point so that conditions of $|s| \neq |t|$, $s \neq 0$, and $t \neq 0$ are satisfied, and
    the first point and the second point include identification information for identifying the first point and the second point as attribute information in addition to information on a layer arranged.

2. The method according to claim 1, wherein the mask data is such that the mark seed data is arranged in accordance with a mark-seed-data arrangement rule that determines in advance a layer and a position on the scribe line to arrange the mark seed data and a state of arranging the mark seed data.

3. The method according to claim 1, wherein the inspection mark includes attribute information including a layer in which the mark seed data is arranged.

4. The method according to claim 1, wherein the first inspection mark includes three or more points arranged according to a predetermined rule.

5. The method according to claim 4, wherein
    the arrangement check rule is a first arrangement check rule that defines the arrangement state of the mark seed data with reference to a Cartesian coordinate system that is provided in a predetermined direction with respect to a direction specifying unit formed in the process target, and
    the judging includes judging whether an arrangement state of the first mark seed data with reference to the Cartesian coordinate system follows the first arrangement check rule.

6. The method according to claim 5, wherein
    the detecting arrangement state includes
        referring to arrangement state correspondence information including a correspondence relationship between a predetermined rotation angle from an arrangement direction as a reference for the mark seed data and vector information on the first inspection mark, and a correspondence relationship between a predetermined rotation angle from a state in which the mark seed data is mirrored with a predetermined direction as an axis in the arrangement direction as a reference for the mark seed data and the vector information on the first inspection mark, and
        detecting a presence or absence of mirroring and a rotation angle from the arrangement direction as a reference for the mark seed data as the arrangement state of the first inspection mark for each first inspection mark of each of the mark seed data in the mask data.

7. The method according to claim 6, wherein
    the first arrangement check rule includes
        a type of the mark seed data to be used in each layer,
        a mirroring rule that defines the presence or absence of mirroring at an arrangement position on a mask corresponding to the layer for each type of the mark seed data, and
        a rotation angle rule that defines a rotation angle from the arrangement direction as a reference for the mark seed data, and
    the judging includes judging whether the mark seed data is correctly arranged on the scribe line by comparing whether the presence or absence of mirroring and the rotation angle of the mark seed data detected at the detecting matches the mirroring rule and the rotation angle rule in the first arrangement check rule corresponding to a layer in the attribute information.

8. The method according to claim 1, wherein
    the detecting arrangement state includes
        identifying the first point and the second point by using the attribute information on the first inspection mark in the mark seed data, and
        obtaining coordinates of the second point with reference to the first point as the vector information.

9. The method according to claim 1, wherein
- the inspection mark is a second inspection mark that includes two or more points arranged according to a predetermined rule so that an arrangement allowing direction with respect to a pattern in a chip arranged in the mask data is detected,
- the arrangement check rule is a second arrangement check rule that defines a direction with respect to the pattern in the chip with respect to a direction specifying unit formed in the process target,
- the detecting arrangement state includes detecting the arrangement allowing direction with respect to the pattern in the chip as the arrangement state by using the second inspection mark, and
- the judging includes judging whether the arrangement allowing direction with respect to the pattern in the chip detected at the detecting matches the second arrangement check rule.

10. The method according to claim 9, wherein the second inspection mark includes two or more points arranged according to a predetermined rule.

11. The method according to claim 9, wherein the detecting arrangement state includes
- referring to an allowing direction correspondence information including a correspondence relationship between a predetermined rotation angle from an arrangement direction as a reference for the mark seed data on a coordinate system of the mask and vector information on the second inspection mark, and
- detecting a rotation angle from the arrangement direction as a reference for the mark seed data on the coordinate system of the mask as the arrangement state of the second inspection mark for each second inspection mark of each of the mark seed data in the mask data.

12. The method according to claim 11, wherein
- the second arrangement check rule includes a rotation angle rule that defines a rotation angle from the arrangement direction as a reference for the mark seed data, and
- the judging includes judging whether the rotation angle of the mark seed data detected at the detecting matches the rotation angle rule in the second arrangement check rule.

13. The method according to claim 9, wherein
- the second inspection mark includes a third point in the mark seed data and a fourth point that is shifted by a distance u with fixed value in a third direction and by a distance v with fixed value in a fourth direction that is vertical to the third direction from the third point so that a condition that u and v do not become zero simultaneously is satisfied, and
- the third point and the fourth point include identification information for identifying the third point and the fourth point as attribute information in addition to information on a layer arranged.

14. The method according to claim 13, wherein
the detecting arrangement state includes
- identifying the third point and the fourth point by using the attribute information on the second inspection mark in the mark seed data, and
- obtaining coordinates of the fourth point with reference to the third point as the vector information.

15. The method according to claim 9, wherein the arrangement allowing direction of the pattern is a direction of a word line formed in the chip.

16. A non-transitory computer-readable storage medium storing mask data, the mask data comprising:
- chip data; and
- scribe line data formed around the chip data,
- wherein the scribe line data includes mark seed data that includes mark data that is a pattern of a mark for alignment or measurement and an inspection mark that includes vector information for detecting a rotation of the mark data in units of a predetermined angle of the mark data and is not drawn on a mask,
- the inspection mark is a first inspection mark that includes a first point in the mark seed data and a second point that is shifted by a distance s with fixed value in a first direction and by a distance t with fixed value in a second direction that is vertical to the first direction from the first point so that conditions of $|s| \neq |t|$, $s \neq 0$, and $t \neq 0$ are satisfied, and
- the first point and the second point include identification information for identifying the first point and the second point as attribute information in addition to information on a layer arranged.

17. The mask data according to claim 16, wherein the inspection mark is the vector information capable of further detecting mirroring of the mark data.

18. The mask data according to claim 16, wherein the inspection mark includes two or more points arranged according to a predetermined rule so that an arrangement allowing direction with respect to a pattern in a chip arranged in the chip data is detected.

19. A method of manufacturing a semiconductor device comprising:
- generating, by a processor, mark seed data that includes an inspection mark that includes vector information for detecting a rotation in units of a predetermined angle or a mirroring of the mark and that is not drawn on the mask and the mark data;
- generating, by a processor, mask data in which the mark seed data is arranged on a scribe line of the mask;
- calculating, by a processor, coordinates of the inspection mark from a reference position set to the mask data for each of the mark seed data in the mask data;
- detecting, by a processor, an arrangement state of the inspection mark with respect to the reference position by using calculated coordinates and the vector information on the inspection mark;
- judging, by a processor, whether the mark seed data is correctly arranged on the scribe line by comparing the arrangement state of the inspection mark with an arrangement check rule that defines an arrangement state of the mark seed data on the mask; and thereafter
- exposing a resist that is applied on a process target by using a mask on which a pattern of a chip body and a pattern of a mark on a scribe line are formed on a transparent substrate and processing the process target by using the pattern obtained by developing the resist, based on the mask data in which the mark seed data is correctly arrange,
- wherein the inspection mark is a first inspection mark that includes a first point in the mark seed data and a second point that is shifted by a distance s with fixed value in a first direction and by a distance t with fixed value in a second direction that is vertical to the first direction from the first point so that conditions of $|s| \neq |t|$, $s \neq 0$, and $t \neq 0$ are satisfied, and
- the first point and the second point include identification information for identifying the first point and the second point as attribute information in addition to information on a layer arranged.

* * * * *